(12) United States Patent
Kozuma et al.

(10) Patent No.: US 8,472,235 B2
(45) Date of Patent: Jun. 25, 2013

(54) SEMICONDUCTOR DEVICE

(75) Inventors: Munehiro Kozuma, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 289 days.

(21) Appl. No.: 13/048,291

(22) Filed: Mar. 15, 2011

(65) Prior Publication Data

US 2011/0235389 A1    Sep. 29, 2011

(30) Foreign Application Priority Data

Mar. 25, 2010    (JP) .................................. 2010-070401

(51) Int. Cl.
*G11C 17/00* (2006.01)

(52) U.S. Cl.
USPC ...................... 365/104; 365/226; 365/189.05

(58) Field of Classification Search
USPC ..................................... 365/104, 226, 189.05
See application file for complete search history.

(56) References Cited

U.S. PATENT DOCUMENTS

| | | |
|---|---|---|
| 4,240,151 A | 12/1980 | Kawagoe |
| 4,661,927 A | 4/1987 | Graebel |
| 4,805,143 A | 2/1989 | Matsumoto et al. |
| 5,226,014 A | 7/1993 | McManus |
| 5,731,856 A | 3/1998 | Kim et al. |
| 5,744,864 A | 4/1998 | Cillessen et al. |
| 5,761,700 A | 6/1998 | Cozart et al. |
| 5,787,033 A | 7/1998 | Maeno |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,906,974 B2 | 6/2005 | Jeung |
| 6,996,660 B1 * | 2/2006 | Moore et al. ................... 711/102 |

(Continued)

FOREIGN PATENT DOCUMENTS

| | | |
|---|---|---|
| CN | 1156324 A | 8/1997 |
| CN | 1516189 A | 7/2004 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Son Dinh
*Assistant Examiner* — Nam Nguyen
(74) *Attorney, Agent, or Firm* — Fish & Richardson P.C.

(57) ABSTRACT

An object is reduction in power consumption of a semiconductor device including a memory circuit. In the semiconductor device including a memory circuit, the memory circuit includes a memory cell including a semiconductor element and a memory cell that does not include a semiconductor element in a region defined by a word line and a bit line which intersect with each other. A transistor formed using an oxide semiconductor so as to have extremely low off-state current is used as the semiconductor element, so that the reading precision is improved and thus low voltage operation can be performed. The memory cells store data high or data low. The memory cell comprising a semiconductor element stores minor data of high and low, and the memory cell that does not comprise the semiconductor element stores major data of high and low.

18 Claims, 13 Drawing Sheets

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,130,234 B2 | 10/2006 | Shionoiri et al. |
| 7,211,825 B2 | 5/2007 | Shih et al |
| 7,274,210 B2 | 9/2007 | Ogata |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,366,051 B2 | 4/2008 | Ueda |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,649,787 B2 | 1/2010 | Kozuma et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0163674 A1 | 8/2003 | Yoshimura et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0047178 A1 | 3/2004 | Kanzaki et al. |
| 2004/0120193 A1 | 6/2004 | Nakaya |
| 2004/0127038 A1 | 7/2004 | Carcia et al. |
| 2005/0003603 A1 | 1/2005 | Takahashi |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0028194 A1 | 2/2007 | Kurokawa |
| 2007/0029994 A1 | 2/2007 | Dembo |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126059 A1 | 6/2007 | Dembo et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0259693 A1 | 10/2008 | Kozuma et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0118620 A1 | 5/2010 | Kozuma et al. |

FOREIGN PATENT DOCUMENTS

| | | |
|---|---|---|
| EP | 1 134 811 A1 | 9/2001 |
| EP | 1 737 044 A1 | 12/2006 |
| EP | 1 746 659 A2 | 1/2007 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-120693 A | 5/1997 |
| JP | 11-505377 A | 5/1999 |
| JP | 2000-044236 A | 2/2000 |
| JP | 2000-150900 A | 5/2000 |
| JP | 2002-063796 A | 2/2002 |
| JP | 2002-073327 A | 3/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-323315 A | 11/2003 |
| JP | 2004-103128 A | 4/2004 |
| JP | 2004-103957 A | 4/2004 |
| JP | 2004-199813 A | 7/2004 |
| JP | 2004-273614 A | 9/2004 |
| JP | 2004-273732 A | 9/2004 |
| JP | 2005-025845 A | 1/2005 |
| JP | 2008-091005 A | 4/2008 |
| KR | 1997-0012778 A | 3/1997 |
| WO | 00/30183 A1 | 5/2000 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous IN-GA-ZN-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous IN-GA-ZN-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, 68.3: Invited Paper:Transparent Amorphous Oxide Semiconductors for High Performance TFT, SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States,"SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, Vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using IN-GA-ZN-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

International Search Report, PCT Application No. PCT/JP2011/054835, dated May 24, 2011, 4 pages.

Written Opinion, PCT Application No. PCT/JP2011/054835, dated May 24, 2011, 5 pages.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al.. "Development of Driver-Integrated Panel Using Amorphous IN-GA-ZN-Oxide TFT," AM-FPD'09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, Vol, 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous IN-GA-ZN-Oxide TFTS," IDW '09 : Proceedings of the 16th International Display Workshops, 2009, pp. 689-692.

Son, K et al.. "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Hiroki Dembo et al.; "RFCPUs on Glass and Plastic Substrates fabricated by TFT Transfer Technology", IEDM 05: Technical Digest of International Electron Devices Meeting; Dec. 5, 2005; pp. 1067-1069.

* cited by examiner

3000

3000

3000

3000

3000

3000

SEMICONDUCTOR DEVICE

TECHNICAL FIELD

One embodiment of the present invention relates to a semiconductor device including a memory circuit.

BACKGROUND ART

In recent years, products with central processing units (CPUs), such as household electrical appliances and computers, have spread in the world and serve as necessities in our life. Generally, these products are equipped with integrated circuit components such as a dedicated circuit having a specific function, a memory circuit, in addition to the CPU. For example, in a product with a CPU and a memory circuit, the memory circuit functions as a program storage area or working area of the CPU.

As a product with a CPU and a memory circuit, for example, a semiconductor device capable of radio communication disclosed in Non-Patent Document 1 is well known. Such a semiconductor device is called a wireless chip, wireless IC, or the like.

REFERENCE

[Non-Patent Document]
[Non-Patent Document 1]
Hiroki Dembo et al, "RFCPUs on Glass and Plastic Substrates Fabricated by TFT Transfer Technology", IEEE, TECHNICAL DIGEST OF INTERNATIONAL ELECTRON DEVICES MEETING, Dec. 5, 2005, pp. 1067-1069

DISCLOSURE OF INVENTION

For improvement in operation speed of the CPU, a memory circuit is required to operate at higher speed. As a result, power consumption of the memory circuit accounts for the major part of that of a circuit portion.

However, the problem is that there is no attempt to reduce power consumption in the aspect of the whole system integrated with the CPU and memory circuit although the power consumption of individual components is attempted to be cut down, for in general the CPU and the memory circuit are designed separately as versatile components.

Since the off-state current of the conventional transistor included in the above circuit is high, there is a problem in that leakage current of the transistor causes noise of a bit line in a memory circuit, for example.

Therefore, an object of one embodiment of the invention disclosed in this specification is to provide a semiconductor device by which the above problems are solved.

One embodiment of the invention disclosed in this specification relates to a semiconductor device in which a transistor including an oxide semiconductor is employed as a transistor used in a memory circuit and a configuration of the memory cell is determined depending on data stored in the memory circuit so that the power consumption of the semiconductor device can be reduced.

One embodiment of the present invention is a semiconductor device including a memory circuit and a central processing unit, in which the memory circuit includes word lines, bit lines intersecting the word lines, and memory cells provided in regions defined by the word lines and the bit lines which intersect with each other; the memory cells include a memory cell including a semiconductor element and a memory cell that does not include the semiconductor element; the semiconductor element is a transistor including an oxide semiconductor in a channel formation region; and a gate of the transistor is electrically connected to the word line, a drain of the transistor is electrically connected to the bit line, and a source of the transistor is electrically connected to a reference potential line.

Another embodiment of the present invention is a semiconductor device including a memory circuit and a dedicated circuit, in which the memory circuit includes word lines, bit lines intersecting the word lines, and memory cells provided in regions defined by the word lines and the bit lines which intersect with each other; the memory cells include a memory cell including a semiconductor element and a memory cell that does not include the semiconductor element; the semiconductor element is a transistor including an oxide semiconductor in a channel formation region; and a gate of the transistor is electrically connected to the word line, a drain of the transistor is electrically connected to the bit line, and a source of the transistor is electrically connected to a reference potential line.

Another embodiment of the present invention is a semiconductor device including a memory circuit, a central processing unit, and a dedicated circuit, in which the memory circuit includes word lines, bit lines intersecting the word lines, and memory cells provided in regions defined by the word lines and the bit lines which intersect with each other; the memory cells include a memory cell including a semiconductor element and a memory cell that does not include the semiconductor element; the semiconductor element is a transistor including an oxide semiconductor in a channel formation region; and a gate of the transistor is electrically connected to the word line, a drain of the transistor is electrically connected to the bit line, and a source of the transistor is electrically connected to a reference potential line.

Here, a "memory cell including a semiconductor element" indicates a memory cell in which a semiconductor element is electrically connected to a word line and a bit line which form the memory cell. Further, a memory cell which does not include a semiconductor element indicates a memory cell in which a semiconductor element is not formed and a memory cell in which a semiconductor element that is not electrically connected to one or both of a word line and a bit line is formed. In the case of the memory cell in which a semiconductor element that is not electrically connected to one or both of a word line and a bit line is formed, the semiconductor element does not drive; thus, the memory cell can be regarded as a memory cell which does not include a semiconductor element substantially.

The transistor including an oxide semiconductor is preferably formed with use of a highly-purified oxide semiconductor in which the number of carries is extremely small. In the transistor including the oxide semiconductor, the off-state current density per a channel width of 1 μm at room temperature can be less than or equal to 10 aA/μm ($1\times10^{-17}$ A/μm), further less than or equal to 1 aA/μm ($1\times10^{-18}$ A/μm), still further less than or equal to 10 zA/μm ($1\times10^{-20}$ A/μm). Therefore, in the memory circuit which is one embodiment of the present invention, noise of a bit line can be prevented and a signal can be output stably.

Each bit line is connected to a pre-charge circuit including a transistor including an oxide semiconductor in a channel formation region. The off-state current of the transistor is extremely low like the transistor described above; thus, the potential of a bit line can be kept stable.

The memory cell including a semiconductor element and the memory cell which does not include a semiconductor element each store data high or data low. The memory cell including a semiconductor element stores minor data of high and low which constitute the data, and the memory cell that does not include the semiconductor element stores major data of high and low.

In a semiconductor device to which one embodiment of the present invention is applied, a transistor including an oxide semiconductor is used in a memory circuit, whereby noise of a bit line can be prevented. Further, the memory circuit includes a memory cell that does not include the semiconductor element, so that power consumption of the semiconductor device can be reduced.

BEST MODE FOR CARRYING OUT THE INVENTION

Figure 1:
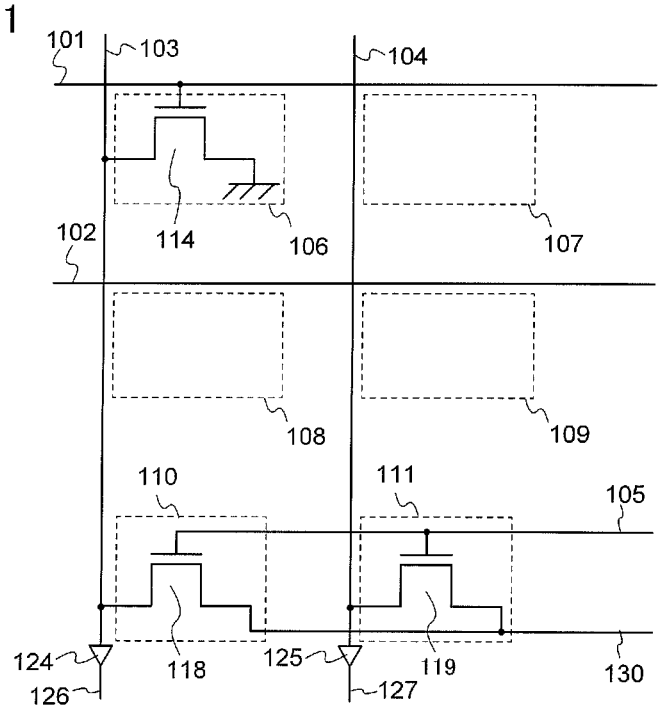
FIG. 1 is a diagram illustrating a memory circuit.

Embodiments of the present invention will be described below with reference to drawings. The present invention can be carried out in many different modes, and it is easily understood by those skilled in the art that the modes and details disclosed herein can be modified in various ways without departing from the spirit and the scope of the present invention. Therefore, the present invention should not be interpreted as being limited to the description of the Embodiments to be given below. Note that in all the drawings that illustrate the Embodiments, the same reference numerals are used for the same portions or the portions having similar functions, and the repeated description thereof is omitted.

(Embodiment 1)

Figure 3:
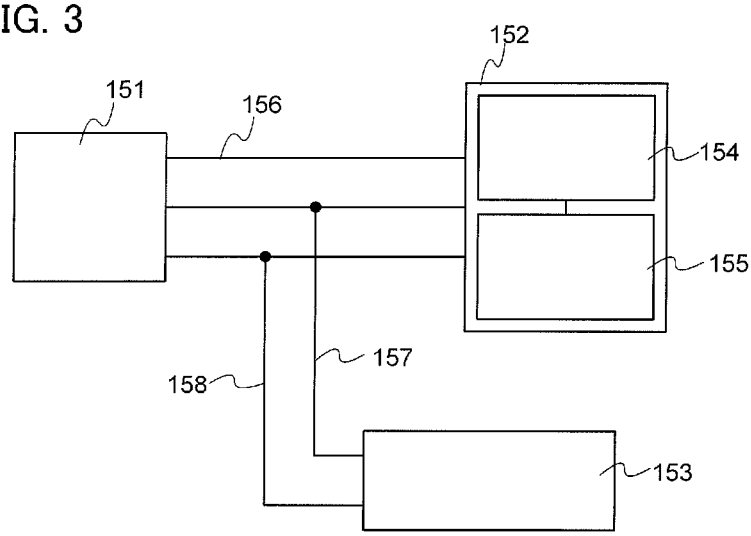
FIG. 3 is a block diagram illustrating a configuration example of a semiconductor device including a memory circuit and a CPU.

In this embodiment, a semiconductor device including a memory circuit and a CPU will be described. FIG. 3 is a block diagram illustrating a configuration example of the semiconductor device including the memory circuit and the CPU.

The semiconductor device illustrated in FIG. 3 includes a CPU 151, a main memory 152, an input/output interface 153, an address bus 156, a data bus 157, and a controller bus 158.

The main memory 152 includes a ROM 154 and a RAM 155. The ROM 154 is used as a program memory which stores a program executed by the CPU 151. The RAM 155 is used as a working memory for executing a program by the CPU 151.

The CPU 151 and the main memory 152 are connected via the address bus 156. Further, the CPU 151, the main memory 152, and the input/output interface 153 are connected to each other via the data bus 157 and the controller bus 158.

The CPU 151 controls operation of an apparatus. Data required for the CPU 151 to execute a program is stored in the ROM 154 included in the main memory 152.

The ROM 154 is a memory circuit only for reading out data. Data stored in the ROM 154 is fixed in a manufacturing stage.

Since programming data required for the CPU 151 to execute a command or a process is stored in the ROM 154, the process operation of the CPU 151 and the data reading from the main memory 152 are performed repeatedly. The ROM 154 consumes electricity in reading out the data required for the CPU 151 operation.

The RAM 155 is a memory circuit which is capable of writing and rewriting data. The RAM 155 is used mainly for storing a processing result of the CPU 151. Input of a signal from an external device and output of a signal to an external device are carried out via the input/output interface 153.

Data used in the semiconductor device illustrated in FIG. 3, such as data stored in the main memory 152, is described in binary scale: that is, the data is described as "1" or "0". Hereinafter, the "1" and "0" which constitute the data are described as "high" and "low", respectively, depending on the potential of a signal.

The address bus 156 is a wiring (route) for transmitting addresses of commands or data required by the CPU 151 to the main memory 152. The data bus 157 is a wiring (route) for reading out and writing data from/to the main memory 152, and for obtaining and providing data from/for an external device via the input/output interface 153. The controller bus 158 is a wiring (route) for providing control information for the main memory 152 and the input/output interface 153.

Figure 4:
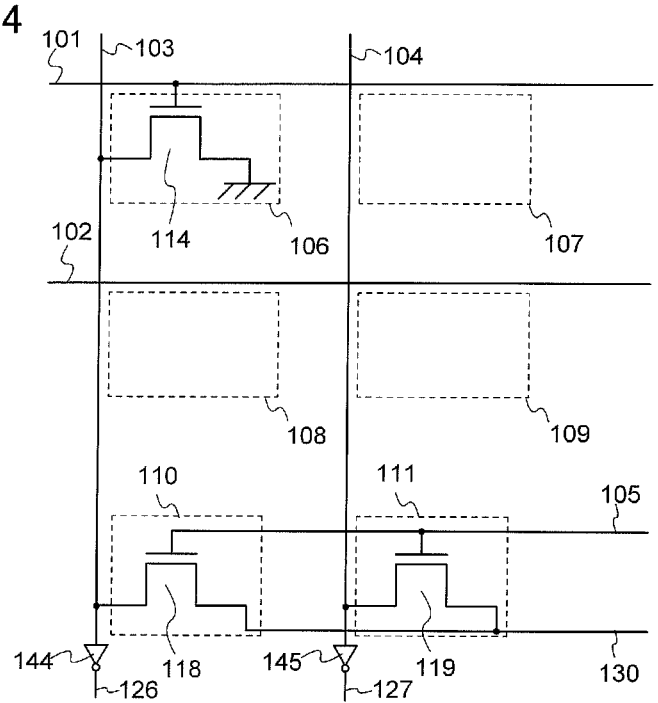
FIG. 4 is a diagram illustrating a memory circuit.

Next, a configuration of the ROM 154 will be described with reference to FIG. 1 and FIG. 4. FIG. 1 is a circuit diagram illustrating a configuration example where "high" is a majority in the data stored in the ROM 154. FIG. 4 is a circuit diagram illustrating a configuration example where "low" is a majority in the data stored in the ROM 154.

In order to determine the configuration of the ROM 154, data stored in the ROM 154, for example, a program required by the CPU 151, is analyzed to determine which of "high" and "low" is the major data. By determining the configuration of the ROM 154 depending on the result, the power consumption of the whole semiconductor device can be reduced. First, a circuit configuration example of the ROM 154 where "high" is the major data will be described with reference to FIG. 1.

As illustrated in FIG. 1, the ROM 154 includes a first word line 101, a second word line 102, a first bit line 103, a second bit line 104, a first memory cell 106, a second memory cell 107, a third memory cell 108, and a fourth memory cell 109.

In order to read out data from these memory cells, the memory circuit of this embodiment includes a first pre-charge circuit 110, a second pre-charge circuit 111, a first buffer 124, a second buffer 125, a first memory output line 126, and a second memory output line 127.

The first pre-charge circuit 110 can precharge the first bit line 103 which is connected to the first pre-charge circuit 110. The second pre-charge circuit 111 can precharge the second bit line 104 which is connected to the second pre-charge circuit 111.

In a configuration example of the memory circuit (the ROM 154) in FIG. 1, the number of word lines is two and the number of bit lines is two, and four memory cells are arrayed in two columns and two rows. The number of word lines and bit lines, and the array and the number of memory cells are not limited to the configuration example illustrated in FIG. 1. More than two word lines and more than two bit lines can be provided. The array and the number of memory cells are determined depending on the number of these wirings. This is also the same with configuration examples of memory circuits illustrated in other drawings.

As illustrated in FIG. 1, the word lines and the bit lines are arranged to be perpendicular to each other. The first memory cell 106, the second memory cell 107, the third memory cell 108, and the fourth memory cell 109 are provided in four regions (regions enclosed by dotted lines in FIG. 1) defined by the word lines and the bit lines which intersect with each other.

The first memory cell 106 is a cell including a semiconductor element connected to the bit line and the word line, and is provided in a region defined by the first word line 101 and the first bit line 103 which intersect with each other.

The second memory cell 107 is a vacant cell, and is provided in a region defined by the first word line 101 and the second bit line 104 which intersect with each other. Here, the vacant cell indicates a cell which does not include a semiconductor element such as a diode, transistor, or memory element; that is, a memory cell whose inside is vacant.

The third memory cell 108 is also a vacant cell, and is provided in a region defined by the second word line 102 and the first bit line 103 which intersect with each other.

The fourth memory cell 109 is also a vacant cell, and is provided in a region defined by the second word line 102 and the second bit line 104 which intersect with each other.

A transistor, diode, memory element (memory transistor), or the like can be used as the semiconductor element included in the first memory cell 106. In this embodiment, a transistor is used as the semiconductor element.

A transistor 114 preferably has low off-state current characteristics in order to prevent unnecessary leakage of charges which causes noise of the first bit line. Thus, although a transistor including a silicon semiconductor can be used as the transistor 114, it is preferable to use a transistor including an oxide semiconductor so as to have extremely low off-state current characteristics. The same can be said for a first pre-charging transistor 118 used in the first pre-charge circuit 110 and a second pre-charging transistor 119 used in the second pre-charge circuit 111.

For example, for the oxide semiconductor, a thin film represented by the chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In this embodiment, the transistor 114 formed in the memory cell illustrated in FIG. 1 is an n-channel transistor whose channel formation region is formed using an oxide semiconductor. A transistor connected to a bit line, a transistor connected to a word line, and a transistor included in a CPU or a dedicated circuit which is connected to a memory circuit, except for transistors used in pre-charge circuits described below, may be formed using silicon or the like.

In the first memory cell 106, a gate electrode of the transistor 114 is connected to the first word line 101; a drain electrode thereof is connected to the first bit line 103; a source electrode thereof is connected to a reference potential line so as to have a fixed potential. For example, the potential of the reference potential line connected to the source electrode is a ground potential in the configuration example of FIG. 1.

In this specification, a cell including a semiconductor element in which one of the electrodes is connected to the reference potential line is referred to as a "grounded cell"; accordingly, the first memory cell 106 is a grounded cell.

The first pre-charge circuit 110 is connected to the first bit line 103, and an input terminal of the first buffer 124 is connected to an output terminal of the first bit line 103. In the same manner as that of the first bit line 103, the second pre-charge circuit 111 is connected to the second bit line 104, and an input terminal of the second buffer 125 is connected to an output terminal of the second bit line 104.

In the case where a conventional transistor formed using silicon or the like is used as the transistor 114, since the off-state current of the transistor is high, a potential is output to a bit line from a memory element that is not supposed to supply a potential to the bit line, so that it is difficult to keep the potential of the bit line. Accordingly, false recognition of reading data occurs. Further, driving at low voltage is difficult.

In one embodiment of the present invention, however, since the transistor formed using an oxide semiconductor so as to have an extremely low off-state current characteristics is used as described above, reading precision can be improved and driving at low voltage is possible without consideration of the change in potential of a bit line due to an off-state current. Further, since potential retention capability is high, a configuration in which a capacitor or a sequential circuit such as a latch circuit is not provided is possible.

Figure 13A:
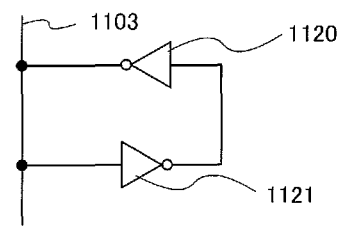
FIGS. 13A and 13B are each a diagram illustrating a latch circuit.
Figure 13B:
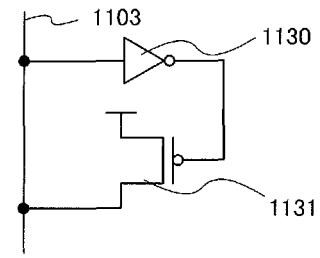

Needless to say, a sequential circuit or a capacitor may be provided; for example, a latch circuit illustrated in FIG. 13A or FIG. 13B may be connected to a bit line so as to be provided between a pre-charge circuit and a memory cell. The latch circuit illustrated in FIG. 13A includes an inverter 1120 and an inverter 1121, and connected to a bit line 1103. The latch circuit illustrated in FIG. 13B includes an inverter 1130 and a p-channel transistor 1131, and connected to the bit line 1103 as illustrated.

The first pre-charge circuit 110 and the second pre-charge circuit 111 have the same configuration, and each of them has a transistor. The first pre-charge circuit 110 includes a first pre-charging transistor 118, and the second pre-charge circuit 111 includes a second pre-charging transistor 119.

Gate electrodes of the first pre-charging transistor 118 and the second pre-charging transistor 119 are connected in common to the pre-charge line 105, and source electrodes thereof are connected in common to a power supply line 130. A drain electrode of the first pre-charging transistor 118 is connected to the first bit line 103, and a source electrode of the second pre-charging transistor 119 is connected to the second bit line 104. The potential of the power supply line 130 is fixed at a constant potential.

As the first pre-charging transistor 118 and the second pre-charging transistor 119, an n-channel transistor including an oxide semiconductor is employed like the transistor 114. When the off-state current of the pre-charging transistor is suppressed to be extremely low, unnecessary flow of charges from the power supply line 130 to the first bit line 103 or the second bit line 104 can be prevented.

An output terminal of the first buffer 124 is connected to the first memory output line 126, and an output terminal of the second buffer 125 is connected to the second memory output line 127.

Next, operation of reading out data from the memory circuit illustrated in FIG. 1 will be described with reference to the timing chart of FIG. 2. The memory circuit illustrated in FIG. 1 is an example of a circuit including the two bit lines and the two word lines; accordingly, the period of time for one data readout operation includes a first pre-charge signal period 208, a first word signal period 209, a first data holding period 210, a second pre-charge signal period 211, a second word signal period 212, and a second data holding period 213, as is shown in the timing chart of FIG. 2.

Figure 2:
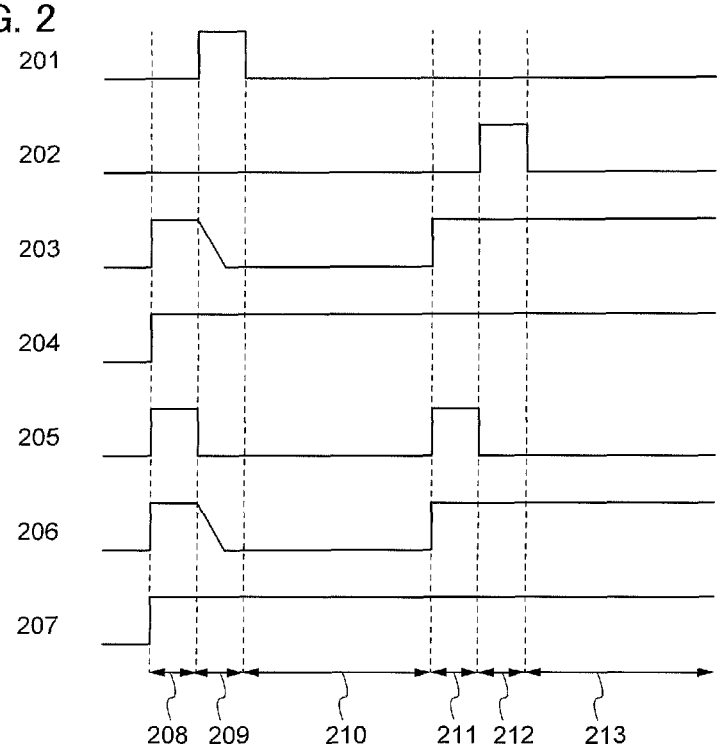
FIG. 2 is a timing chart illustrating operation of the memory circuit.

In FIG. 2, a potential 201 of the first word line, a potential 202 of the second word line, a potential 203 of the first bit line, a potential 204 of the second bit line, a potential 205 of the pre-charge line, a potential 206 of the first memory output line, and a potential 207 of the second memory output line are shown sequentially from the top.

First, when a potential 205 of the pre-charge line is set at "high" in the first pre-charge signal period 208, the potentials of the gate electrodes of the first pre-charging transistor 118 and the second pre-charging transistor 119 become "high".

A potential is supplied to the first bit line 103 from the power supply line 130, which is connected to the drain electrode of the first pre-charging transistor 118, via the first pre-charging transistor 118. A potential is also supplied to the second bit line 104 from the power supply line 130, which is connected to the drain electrode of the second pre-charging transistor 119, via the second pre-charging transistor 119.

As a result, a potential 203 of the first bit line becomes "high" and a potential 204 of the second bit line becomes "high". At this time, the off-state current of the transistor connected to the bit line is extremely low; thus, the potential of the bit line is hardly changed and is kept.

Next, the potential 205 of the pre-charge line is set at "low" and the potential 201 of the first word line is set at "high" in the first word signal period 209, so that "high" is applied to the gate electrode of the transistor 114 in the first memory cell 106.

Upon application of "high" to the gate electrode, the potential 203 of the first bit line becomes "low" since the potential of the source electrode of the transistor 114 is at the ground potential. In this state, the off-state current of the transistor connected to the bit line is extremely low; thus, the potential of the bit line is hardly changed and is kept.

On the other hand, the potential 204 of the second bit line is not changed and is kept at "high", since the second memory cell 107 is a vacant cell. That is, the potential 203 of the first bit line becomes "low" and the potential 204 of the second bit line becomes "high".

Here, the potential 203 of the first bit line is output as a signal "low" to the first memory output line 126 via the first buffer 124, and the potential 204 of the second bit line is output as a signal "high" to the second memory output line 127 via the second buffer 125. That is, "low" and "high" can be read out from the first memory cell 106 and the second memory cell 107, respectively, which correspond to the first word line 101.

Also in the first data holding period 210, the off-state current of a transistor connected to each bit line is extremely low; thus, the potential 203 of the first bit line and the potential 204 of the second bit line are hardly changed and are kept. Accordingly, the potential 206 of the first memory output line is kept at "low" and the potential 207 of the second memory output line is kept at "high".

Next, in the second pre-charge signal period 211, the potential 205 of the pre-charge line is set at "high", and then the potentials of the gate electrodes of the first pre-charging transistor 118 and the second pre-charging transistor 119 become "high".

A potential is supplied to the first bit line 103 from the power supply line 130, which is connected to the drain electrode of the first pre-charging transistor 118, via the first pre-charging transistor 118. A potential is also supplied to the second bit line 104 from the power supply line 130, which is connected to the drain electrode of the second pre-charging transistor 119, via the second pre-charging transistor 119.

As a result, the potential 203 of the first bit line becomes "high" and the potential 204 of the second bit line is also kept at "high".

Next, in the second word signal period 212, the potential 205 of the pre-charge line is set at "low" and the potential 202 of the second word line is set at "high".

The potential 203 of the first bit line and the potential 204 of the second bit line are not changed and kept at "high", since no memory cell is electrically connected to the second word line 102.

After that, the potential 203 of the first bit line is output as a signal "high" to the first memory output line 126 via the first buffer 124. The potential 204 of the second bit line is output as a signal "high" to the second memory output line 127 via the second buffer 125. That is, the data "high" and "high" can be read out from the third memory cell 108 and the fourth memory cell 109, respectively.

In the second data holding period 213, the off-state current of a transistor connected to each bit line is extremely low; thus, the potential 203 of the first bit line and the potential 204 of the second bit line are hardly changed and are kept. Accordingly, the potential 206 of the first memory output line and the potential 207 of the second memory output line are kept at "high".

As described above, the data "low", "high", "high", and "high" is acquired from the first to fourth memory cells 106 to 109, respectively.

It is not necessary to drive transistors in the memory cells in readout operation because in the second to fourth memory cells 107 to 109 storing the data "high", no semiconductor elements are connected to the word lines. Accordingly, power consumption of the semiconductor device can be reduced.

In particular, in the second word line 102 to which no semiconductor elements is connected, electric power for driving the word line is extremely small. Thus, in the case where "high" is the major data in the data stored in a memory circuit, it is preferable that a vacant cell be used as a memory cell storing "high" like the configuration example of the memory circuit illustrated in FIG. 1.

Next, a circuit configuration example of a memory circuit where "low" is the major data in the data stored in the ROM 154 will be described with reference to FIG. 4.

In FIG. 4, the same reference numerals as those in FIG. 1 indicate the same components as those in FIG. 1. The configuration of the memory circuit illustrated in FIG. 4 differs from that of FIG. 1 in that the first buffer 124 and the second buffer 125 illustrated in FIG. 1 are replaced with a first inverter 144 and a second inverter 145, respectively. The other components are the same as those in the circuit illustrated in FIG. 1.

Next, operation of reading out data from the memory circuit illustrated in FIG. 4 will be described with reference to the timing chart of FIG. 5. The memory circuit illustrated in FIG. 4 is an example of a circuit including the two bit lines and the two word lines; accordingly, the period of time for one data readout operation includes a first pre-charge signal period 508, a first word signal period 509, a first data holding period 510, a second pre-charge signal period 511, a second word signal period 512, and a second data holding period 513, as is shown in the timing chart of FIG. 5.

Figure 5:
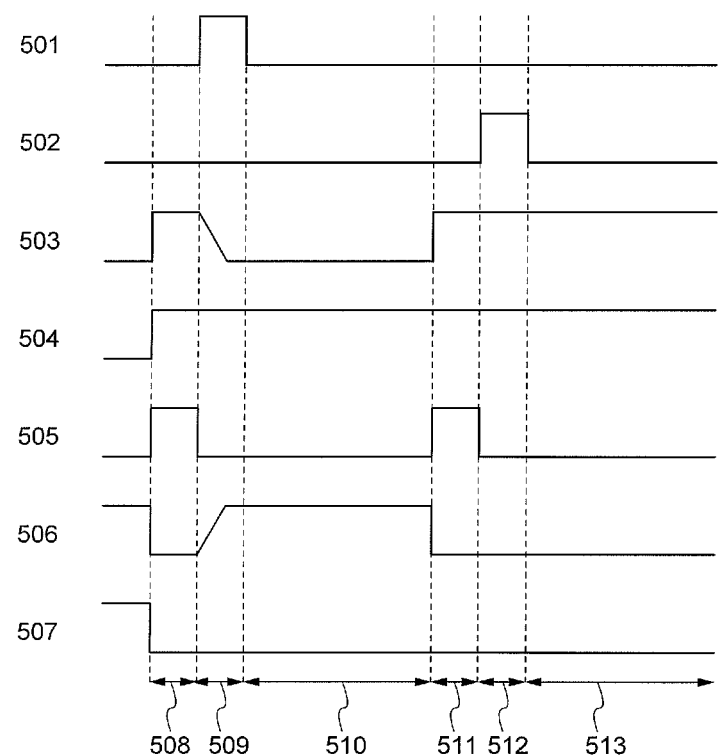
FIG. 5 a timing chart illustrating operation of the memory circuit.

In FIG. 5, a potential 501 of the first word line, a potential 502 of the second word line, a potential 503 of the first bit line, a potential 504 of the second bit line, a potential 505 of the pre-charge line, a potential 506 of the first memory output line, and a potential 507 of the second memory output line are shown sequentially from the top.

First, the potential 505 of the pre-charge line is set at "high" in the first pre-charge signal period 508. At this time, the potentials of the gate electrodes of the first pre-charging transistor 118 and the second pre-charging transistor 119 become "high".

A potential is supplied to the first bit line 103 from the power supply line 130, which is connected to the drain electrode of the first pre-charging transistor 118, via the first pre-charging transistor 118. A potential is also supplied to the second bit line 104 from the power supply line 130, which is connected to the drain electrode of the second pre-charging transistor 119, via the second pre-charging transistor 119.

As a result, the potential 503 of the first bit line becomes "high" and the potential 504 of the second bit line becomes "high". At this time, the off-state current of the transistor connected to the bit line is extremely low; thus, the potential of the bit line is hardly changed and is kept.

Next, the potential 505 of the pre-charge line is set at "low" and the potential 501 of the first word line is set at "high" in the first word signal period 509, so that "high" is applied to the gate electrode of the transistor 114 in the first memory cell 106.

Upon application of "high" to the gate electrode, the potential 503 of the first bit line becomes "low" since the potential of the source electrode of the transistor 114 is at the ground potential. In this state, the off-state current of the transistor connected to the bit line is extremely low; thus, the potential of the bit line is hardly changed and is kept.

On the other hand, the potential 504 of the second bit line is not changed and is kept at "high", since the second memory cell 107 is a vacant cell. That is, the potential 503 of the first bit line becomes "low" and the potential 204 of the second bit line becomes "high".

The potential 503 of the first bit line and the potential 504 of the second bit line are input to and inverted in the first inverter 144 and the second inverter 145, respectively. Accordingly, a signal "high" is output via the first memory output line 126, and a signal "low" is output via the second memory output line 127. That is, the data "high" and "low" is read out from the first memory cell 106 and the second memory cell 107, respectively.

Also in the first data holding period 510, the off-state current of a transistor connected to each bit line is extremely low; thus, the potential 503 of the first bit line and the potential 504 of the second bit line are hardly changed and are kept. Accordingly, the potential 506 of the first memory output line is kept at "high" and the potential 507 of the second memory output line is kept at "low".

Next, when a potential 505 of the pre-charge line is set at "high" in the second pre-charge signal period 511, the potentials of the gate electrodes of the first pre-charging transistor 118 and the second pre-charging transistor 119 become "high".

A potential is supplied to the first bit line 103 from the power supply line 130, which is connected to the drain electrode of the first pre-charging transistor 118, via the first pre-charging transistor 118. A potential is also supplied to the second bit line 104 from the power supply line 130, which is connected to the drain electrode of the second pre-charging transistor 119, via the second pre-charging transistor 119.

As a result, the potential 503 of the first bit line becomes "high" and the potential 504 of the second bit line is kept at "high".

Next, in the second word signal period 512, the potential 505 of the pre-charge line is set at "low" and the potential 502 of the second word line is set at "high".

The potential 503 of the first bit line and the potential 504 of the second bit line are not changed and kept at "high", since no memory cell is electrically connected to the second word line 102.

The potential 503 of the first bit line and the potential 504 of the second bit line are input to and inverted in the first inverter 144 and the second inverter 145, respectively. Accordingly, a signal "low" is output via the first memory output line 126, and a signal "low" is output via the second memory output line 127. That is, the data "low" and "low" is read out from the third memory cell 108 and the fourth memory cell 109, respectively.

Also in the second data holding period 513, the off-state current of a transistor connected to each bit line is extremely low; thus, without a sequential circuit or a capacitor, the potential 503 of the first bit line and the potential 504 of the second bit line are hardly changed and are kept. Accordingly, the potential 506 of the first memory output line is kept at "low" and the potential 507 of the second memory output line is kept at "low".

As described above, the data "high", "low", "low", and "low" is acquired from the first to fourth memory cells 106 to 109, respectively.

It is not necessary to drive transistors in the memory cells in readout operation because in the second to fourth memory cells 107 to 109 storing the data "low", no semiconductor elements are connected to the word lines. Accordingly, power consumption of the whole semiconductor device can be reduced.

In particular, in the second word line 102 to which no semiconductor elements is connected, electric power for driving the word line is extremely small. Thus, in the case where "low" is the major data in the data stored in a memory circuit, it is preferable that a vacant cell be used as a memory cell storing "low" like the configuration example of the memory circuit illustrated in FIG. 4.

In this manner, power consumption can be reduced quite effectively by setting the memory cell storing major data of "high" and "low" vacant depending on the data stored in the ROM 154 (e.g., the programming data of the CPU 151). Further, heat generation can be suppressed since the power consumption can be reduced. Thus, the configuration of the memory circuit described in this embodiment can provide a semiconductor device with low power consumption and low heat generation.

The memory circuits illustrated in FIG. 1 and FIG. 4 in this embodiment are suitable particularly for a memory circuit (e.g., a mask ROM) in which data stored in each memory cell is fixed in a manufacturing stage.

Note that this embodiment can be combined with any of the other embodiments and examples as appropriate.

(Embodiment 2)

As is described in Embodiment 1, a memory circuit can be configured to minimize the power consumption by analyzing the data of a program required by the CPU in the CPU and the memory circuit storing a program (a program memory), which have a close relation with each other in a configuration of a semiconductor device.

In addition, even when the data of a program is not analyzed, the power consumption can be effectively reduced by changing the configuration of the memory circuit depending on data of NOP commands of the CPU. In this embodiment, such an example will be described.

In this embodiment, a plurality of memory cells storing NOP commands are composed of vacant cells in the memory circuit. For example, in the case where a NOP command consists of data "high" (or "1") only, the memory circuit (the ROM 154) as in FIG. 1 can be used for a program memory.

In the configuration example of the memory circuit illustrated in FIG. 1, the data of the NOP command is stored in the third memory cell 108 and the fourth memory cell 109 which are arrayed in the second row (the second word line 102) of the memory circuit. All the memory cells in the second row are vacant cells, and the signals "high" and "high" can be read out from the third memory cell 108 and the fourth memory cell 109, respectively.

That is, the NOP command described in "1" only can be acquired. The above configuration of the memory circuit can reduce the power consumption required for reading out the NOP command. In addition, heat generation can be suppressed owing to the reduction in the power consumption.

In the case where the NOP command is composed of data "low" (or "0") only, the memory circuit as in FIG. 4 can be employed.

Also in the configuration example illustrated in FIG. 4, the data of the NOP command is stored in the memory cells arrayed in the second row; thus, the signals "low" and "low" are read out from the third memory cell 108 and the fourth memory cell 109, respectively. That is, the NOP command described in "0" only can be acquired.

As described above, the power consumption required for reading out the NOP command of the CPU can be reduced by setting a plurality of memory cells storing the NOP command vacant. The power consumption can be effectively reduced in particular by setting all the memory cells formed corresponding to at least one word line vacant.

Although the NOP command is stored in the memory cells (the third memory cell 108 and the fourth memory cell 109) formed corresponding to the one word line (the second word line 102) in the configuration examples illustrated in FIG. 1 and FIG. 4, the NOP command can also be stored in memory cells formed corresponding to a plurality of word lines.

Note that this embodiment can be combined with any of the other embodiments and examples as appropriate.

(Embodiment 3)

In this embodiment, an example of a memory circuit provided with memory cells in place of vacant cells will be described. The memory cells have functions similar to those of the vacant cells.

In this embodiment, in order that the memory cell has a function similar to that of a vacant cell, a semiconductor element such as a transistor is provided in a memory cell and the semiconductor element is not electrically connected to a word line. The memory cell including the semiconductor element which is not electrically connected to the word line as described above will be referred to as an "open cell".

A configuration example of a memory circuit of this embodiment will be described below with reference to FIG. 6. In this embodiment, a configuration example is described where "high" is the major data in the data stored in a memory circuit. The memory circuit illustrated in FIG. 6 has the same data array as that illustrated in FIG. 1, and the reference numerals in FIG. 1 which are the same as those in FIG. 6 indicate the same components.

Figure 6:
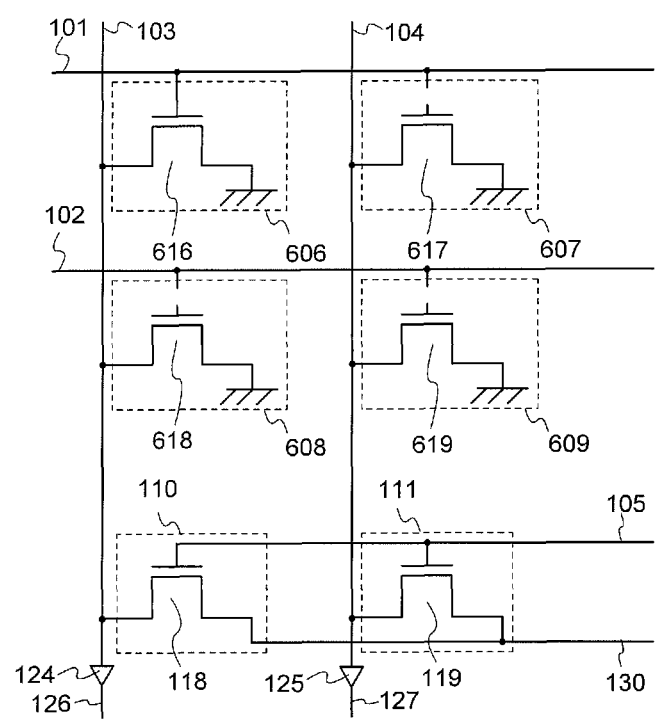
FIG. 6 is a diagram illustrating a memory circuit.

The memory circuit (the ROM 154) illustrated in FIG. 6 has the second to fourth memory cells 607 to 609 whose configurations are different from those illustrated in FIG. 1, and the configurations of the other components in FIG. 6 are the same as those illustrated in FIG. 1. A transistor is formed in each of the memory cells in the memory circuit in FIG. 6.

The first memory cell 606 is a grounded cell like the first memory cell 106 in FIG. 1. A source electrode of the transistor 616 is connected to the reference potential line; a drain electrode thereof is connected to the first bit line 103; and a gate electrode thereof is connected to the first word line 101.

A transistor 616 preferably has low off-state current characteristics in order to prevent unnecessary leakage of charges which causes noise of the first bit line. Thus, although a transistor including a silicon semiconductor can be used as the transistor 616, it is preferable to use a transistor including an oxide semiconductor so as to have extremely low off-state current characteristics. The same can be said for a first pre-charging transistor 118 used in the first pre-charge circuit 110 and a second pre-charging transistor 119 used in the second pre-charge circuit 111.

For example, for the oxide semiconductor, a thin film represented by the chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In this embodiment, the transistor 616 formed in the memory cell and the first pre-charging transistor 118 and the second pre-charging transistor 119 formed in the pre-charge circuits illustrated in FIG. 6 are each an n-channel transistor whose channel formation region is formed using an oxide semiconductor. A transistor connected to a bit line, a transistor connected to a word line, and a transistor included in a CPU or a dedicated circuit which is connected to a memory circuit, except for transistors used in pre-charge circuits, may be formed using silicon or the like.

On the other hand, the second memory cell 607, the third memory cell 608, and the fourth memory cell 609 are open cells.

In the second memory cell 607, the source electrode of the transistor 616 is connected to the reference potential line; the drain electrode thereof is connected to the second bit line 104; and the gate electrode thereof is not electrically connected to the first word line 101.

In the third memory cell 608, a source electrode of the transistor 618 is connected to the reference potential line; a drain electrode thereof is connected to the first bit line 103; and a gate electrode thereof is not electrically connected to the second word line 102.

In the fourth memory cell 609, a source electrode of a transistor 619 is connected to the reference potential line; a drain electrode thereof is connected to the second bit line 104; and a gate electrode thereof is not electrically connected to the second word line 102.

Note that "open" in the "open cell" in this embodiment indicates that a word line and a gate electrode of a transistor are not connected to each other. In order to form an open cell like the second to fourth memory cells 607 to 609, a word line is formed so that the word line and a gate electrode of a transistor are not connected to each other, for example.

Since readout operation of the memory circuit (the ROM 154) in this embodiment is the same as that of the memory circuit illustrated in FIG. 1, data readout operation in this embodiment will be described with reference to the timing chart of FIG. 2.

First, in the first pre-charge signal period 208, the potential 205 of the pre-charge line is set at "high". At this time, the potential of the gate electrode of the first pre-charging transistor 118 becomes "high".

A potential is supplied to the first bit line 103 from the power supply line 130, which is connected to the drain electrode of the first pre-charging transistor 118, via the first pre-charging transistor 118. A potential is also supplied to the second bit line 104 from the power supply line 130, which is connected to the drain electrode of the second pre-charging transistor 119, via the second pre-charging transistor 119. As a result, the potential 203 of the first bit line and the potential 204 of the second bit line become "high". At this time, the off-state current of the transistor connected to the bit line is extremely low; thus, the potential of the bit line is hardly changed and is kept.

Next, in the first word signal period 209, the potential 205 of the pre-charge line is set at "low" and the potential 201 of the first word line is also set at "high", so that in the first memory cell 606, "high" is applied to the gate electrode of the transistor 616, which is connected to the first word line 101. In this state, the off-state current of the transistor connected to the bit line is extremely low; thus, the potential of the bit line is hardly changed and is kept.

At this time, the potential 203 of the first bit line becomes "low" since the potential of the source electrode of the transistor 616 is at the ground potential.

On the other hand, the potential 204 of the second bit line is hardly changed and is kept at "high" since the first word line 101 and the gate electrode of the transistor 617 are not connected in the second memory cell 607.

That is, in the first word signal period 209, the potential 203 of the first bit line and the potential 204 of the second bit line become "low" and "high", respectively.

At this time, the potential 203 of the first bit line and the potential 204 of the second bit line are input to the first buffer 124 and the second buffer 125, respectively. The potentials of the input signals ("low" and "high") are not changed in the first buffer 124 and the second buffer 125, and are output to the first memory output line 126 and the second memory output line 127, respectively.

Accordingly, the signal "low" is output via the first memory output line 126, and the signal "high" is output via the second memory output line 127. That is, the data "low" and "high" can be read out from the first memory cell 606 and the second memory cell 607, respectively.

In the first data holding period 210, the off-state current of the transistor connected to the bit line is low; thus, the potential 203 of the first bit line and the potential 204 of the second bit line are kept. Accordingly, the potential of the first memory output line 126 is kept at "low", and the potential of the second memory output line 127 is kept at "high".

Next, when a potential 205 of the pre-charge line is set at "high" in the second pre-charge signal period 211, the potentials of the gate electrodes of the first pre-charging transistor 118 and the second pre-charging transistor 119 become "high".

A potential is supplied to the first bit line 103 from the power supply line 130, which is connected to the drain electrode of the first pre-charging transistor 118, via the first pre-charging transistor 118. A potential is also supplied to the second bit line 104 from the power supply line 130, which is connected to the drain electrode of the second pre-charging transistor 119, via the second pre-charging transistor 119.

As a result, the potential 203 of the first bit line becomes "high" and the potential 204 of the second bit line is kept at "high". At this time, the off-state current of the transistor connected to the bit line is extremely low; thus, the potential of the bit line is hardly changed and is kept.

Next, in the second word signal period 212, the potential 205 of the pre-charge line is set at "low" and the potential 202 of the second word line is set at "high".

The potential 203 of the first bit line and the potential 204 of the second bit line are not changed and kept at "high", since no memory cell is electrically connected to the second word line 102.

After that, the potential 203 of the first bit line is output as a signal "high" to the first memory output line 126 via the first buffer 124. The potential 204 of the second bit line is output as a signal "high" to the second memory output line 127 via the second buffer 125. That is, the data "high" and "high" can be read out from the first memory cell 608 and the second memory cell 609, respectively.

In the second data holding period 213, the off-state current of a transistor connected to each bit line is low; thus, the potential 203 of the first bit line and the potential 204 of the second bit line are kept. Accordingly, the potential 206 of the first memory output line and the potential 207 of the second memory output line are kept at "high".

As described above, the data "low", "high", "high", and "high" is acquired from the first to fourth memory cells 606 to 609, respectively.

In this embodiment, extra power consumption in reading out data can be reduced since the word line and the gate electrode of the memory cell storing the data "high" are not connected to each other.

In particular, in the case of the second word line 102 which is not connected to a semiconductor element, electric power is not consumed in the word line. Accordingly, the electric power necessary for driving the word line can be reduced.

FIG. 6 illustrates a configuration in which open cells are used for the cells storing "high" when the data "high" is the major data in the data. In the case where "low" is the major data, the open cells may be used as the memory cells storing "low". The configurations of the components other than the memory cells are the same as those illustrated in FIG. 4; thus, a memory circuit can be configured to reduce the power consumption in the case where "low" is the major data in the stored data.

According to this embodiment, the electric power consumed in row decoders connected to word lines can be reduced in a memory circuit. Further, this embodiment is suitable particularly for manufacturing a plurality of memory circuits having different data arrays since data stored in each memory cell can be changed only by changing exposure masks of a photoresist for forming a word line.

The configuration described above can provide a semiconductor device equipped with a memory circuit with reduced power consumption.

Note that this embodiment can be combined with any of the other embodiments and examples as appropriate.

(Embodiment 4)

In this embodiment, a memory circuit including a memory cell capable of rewriting data and a memory cell incapable of rewriting data will be described.

Figure 7:
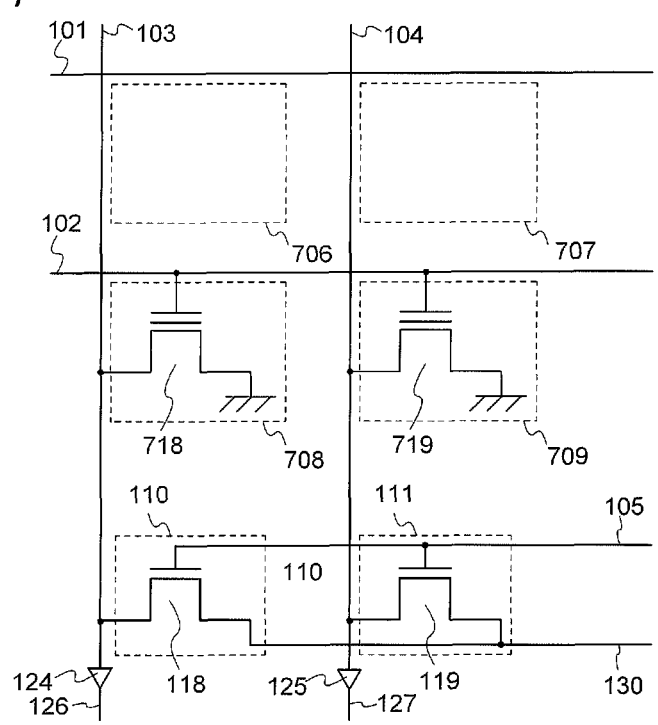
FIG. 7 is a diagram illustrating a memory circuit.

FIG. 7 is a circuit diagram illustrating a configuration example of a memory circuit of this embodiment. The same components in FIG. 1 and FIG. 7 are given the same reference numerals. In the memory circuit illustrated in FIG. 7, a semiconductor element formed in a memory cell is a memory transistor. The memory transistor is, for example, a transistor including a control gate electrode and a floating gate electrode as a gate electrode; or a transistor including a gate insulating film capable of trapping charges.

The memory circuit of this embodiment includes a data non-rewritable region and a data rewritable region. Hence, the memory circuit of this embodiment can be used as the main memory 152 including the ROM 154 and the RAM 155 in FIG. 3.

Programming data required by a CPU is stored in advance in the non-rewritable region as non-rewritable data, whereas data which is output from the CPU when the CPU executes arithmetic operation is stored in the rewritable region. The memory circuit of this embodiment can execute the two operations in one memory circuit.

In the memory circuit illustrated in FIG. 7, all the memory cells formed corresponding to the first word line 101 store fixed non-rewritable data.

In this embodiment, an example is described in which a first memory cell 706 and a second memory cell 707 are vacant cells. The vacant cell indicates a cell which does not include a semiconductor element (in this embodiment, a memory element). In the memory circuit illustrated in FIG. 7, an example is shown in which data "high" is stored in vacant cells.

On the other hand, all the memory cells formed corresponding to the second word line 102 are grounded cells including memory transistors.

In a third memory cell 708, a memory transistor 718 is formed; a gate electrode thereof is connected to the second word line 102; a drain electrode thereof is connected to the first bit line 103; and a source electrode thereof is connected to the reference potential line.

In a fourth memory cell 709, a memory transistor 719 is formed; a gate electrode thereof is connected to the second word line 102; a drain electrode thereof is connected to the second bit line 104; and a source electrode thereof is connected to the reference potential line.

In the case where the memory transistors 718 and 719 include control gate electrodes and floating gate electrodes as gate electrodes, the control gate electrodes are connected to the second word line 102.

Next, data writing operation of the memory circuit illustrated in FIG. 7 will be described.

Data is written to each memory cell on a row basis (on a word line basis). Here, an example is shown in which a transistor including a control gate electrode and a floating gate electrode is used as the memory transistors 718 and 719, and data is written using electrons which are hot carriers. In addition, operation of writing data "high" and "low" to the third memory cell 708 and the fourth memory cell 709, respectively, will be described.

Data writing operation is not executed via the first word line 101 since it is not necessary for the memory cells formed corresponding to the first word line 101.

First, a high potential (a potential higher than the ground potential) is applied to the second word line 102.

Then, a high potential (a potential for turning on a memory transistor) is applied to the first bit line 103. At this time, in the third memory cell 708, current flows into a channel of the memory transistor 718; high-energy electrons (hot carriers) are generated around the drain electrode; and charges are accumulated in the floating gate. The charges of the floating gate electrode make the threshold voltage of the memory transistor 718 shift in the positive direction, and the data "high" is stored.

In the fourth memory cell 709, on the other hand, the second bit line 104 is set at the ground potential, hot carriers are not generated around the drain electrode of the memory transistor 719, and charges are not accumulated in the floating gate electrode. Accordingly, the threshold voltage of the memory transistor 719 does not change and the data "low" is stored.

As described above, the memory transistor stores the data "high" or "low" depending on a potential state of the floating gate electrode.

The data written in the memory transistors is erased by opening a drain electrode, connecting a control gate electrode to the ground, and applying a high voltage to a source electrode. Electrons in the floating gate electrode get a high-energy state by the application of the high voltage to the source electrode, and the electrons can be extracted from the floating gate electrode by tunnel effect. Note that the data stored in all the memory cells including the memory elements is erased since a high voltage is applied to the source electrodes of all the memory cells.

Next, data reading operation will be described.

First, the potential of the pre-charge line 105 is set at "high", and then the potentials of the gate electrodes of the first pre-charging transistor 118 and the second pre-charging transistor 119 become "high".

Then, a potential is supplied to the first bit line 103 from the power supply line 130 via the first pre-charging transistor 118. A potential is supplied to the second bit line 104 from the power supply line 130 via the second pre-charging transistor 119.

As a result, the potential of the first bit line 103 becomes "high", and the potential of the second bit line 104 also becomes "high".

Next, the potential of the pre-charge line 105 is set at "low", and the potential of the second word line 102 is set at "high". Thus, in the third memory cell 708, "high" is applied to the control gate electrode of the memory transistor 718.

At this time, current hardly flows in the memory transistor 718 whose threshold voltage shifts in the positive direction. Thus, the potential of the first bit line 103 is not changed and is kept at "high".

In the fourth memory cell 709, on the other hand, "high" is also applied to a control gate electrode of the memory transistor 719.

At this time, current flows in the memory transistor 719 whose threshold voltage does not change. Thus, the potential of the second bit line 104 decreases and becomes "low".

As described above, the data "high" stored in the third memory cell 708 and "low" stored in the fourth memory cell 709 can be read out.

The first memory cell 706 and the second memory cell 707 are vacant cells; thus, the potentials of the first bit line 103 and the second bit line 104 do not change even when the potential of the first word line 101 is set at "high". Therefore, the data "high" can be read out from each of the first memory cell 706 and the second memory cell 707.

In this manner, the data "high", "high", "high", and "low" can be acquired from the first to fourth memory cells 706 to 709, respectively. That is, the data "high" can be read out from the vacant cells, and the data "high" and "low" can be read out from the memory cells including memory transistors.

In the configuration example of the memory circuit illustrated in FIG. 7, a NOP command described in "high" can be stored by employing vacant cells for all the memory cells formed corresponding to the first word line 101.

In the configuration example of the memory circuit illustrated in FIG. 7, "high" is stored in vacant cells; however, data "low" can be stored in the vacant cells by configuring the components other than the first to fourth memory cells 706 to 709 as in the memory circuit illustrated in FIG. 4.

In that case, the first inverter 144 and the second inverter 145 are connected to the input sides of the first memory output line 126 and the second memory output line 127, respectively. Therefore, the configuration example in FIG. 7 is the same as that described above, the data "low", "low", "low", and "high" can be read out from the first to fourth memory cells 706 to 709, respectively.

In the configuration example illustrated in FIG. 7, the fixed data is stored in the memory cells formed corresponding to one word line. However, the fixed data can be stored in memory cells formed corresponding to a plurality of word lines.

In the configuration example illustrated in FIG. 7, the memory cells storing the fixed data (the non-rewritable data) are composed of vacant cells only. However, data composed of both "high" and "low" can be stored as non-rewritable fixed data when grounded cells including a transistor like the first memory cell 106 illustrated in FIG. 1 and FIG. 4 are used in addition to the vacant cells.

According to this embodiment, the power consumption of the whole semiconductor device including the memory circuit and the CPU can be reduced effectively. Further, heat generation of the semiconductor device can be suppressed owing to the reduction in power consumption.

Note that this embodiment can be combined with any of the other embodiments and examples as appropriate.

(Embodiment 5)

In this embodiment, a configuration example of a semiconductor device including a memory circuit and a dedicated circuit will be described.

Figure 8A:
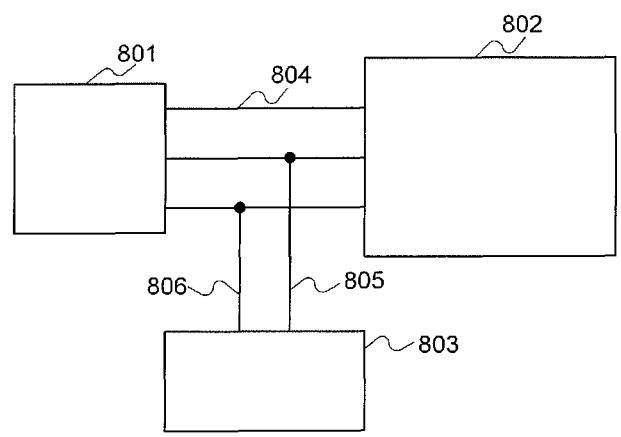
FIGS. 8A and 8B are each a block diagram illustrating a configuration example of a semiconductor device including a memory circuit and a CPU.

FIG. 8A is a block diagram illustrating a configuration example of a semiconductor device including a memory circuit and a dedicated circuit. The semiconductor device illustrated in FIG. 8A includes a main memory 801, a dedicated circuit 802, an input/output interface 803, an address bus 804, a data bus 805, and a controller bus 806.

The main memory 801 and the dedicated circuit 802 are connected to each other via the address bus 804. Further, the main memory 801, the dedicated circuit 802, and the input/output interface 803 are connected to each other via the data bus 805 and the controller bus 806.

The dedicated circuit 802 is, for example, an image processing circuit or a code processing circuit. Since arithmetic operation is executed in the dedicated circuit 802 with the use of data stored in the main memory 801, data required is stored in the main memory 801.

The power consumption of the whole semiconductor device can be reduced and heat generation can be suppressed by applying any of the memory circuits described in Embodiments 1 to 4 to the main memory 801. Any of the memory circuits described in Embodiments 1 to 3 is applied to a non-rewritable memory circuit which is incapable of rewriting data of the main memory 801. A main memory including a data non-rewritable region and a data rewritable region can be formed by applying the memory circuit described in Embodiment 4.

Next, a configuration example of a semiconductor device including a CPU, a dedicated circuit, and a memory circuit will be described with reference to a block diagram of FIG. 8B.

Figure 8B:
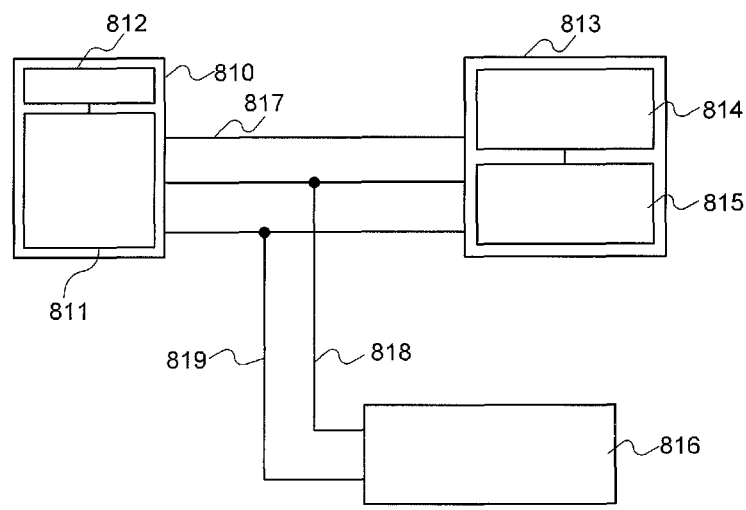

The semiconductor device illustrated in FIG. 8B includes an arithmetic circuit 810, a main memory 813, an input/output interface 816, an address bus 817, a data bus 818, and a controller bus 819. The arithmetic circuit 810 includes a CPU 811 and a dedicated circuit 812, and the main memory 813 includes a ROM 814 and a RAM 815.

The ROM 814 functions as a programming memory which stores a program executed by the CPU 811, and also stores data required for operating the dedicated circuit 812. The RAM 815 functions as a memory used for executing a program by the CPU 811.

The arithmetic circuit 810 and the main memory 813 are connected to each other via the address bus 817. Further, the CPU 811, the main memory 813, and the input/output interface 816 are connected to each other via the data bus 818 and the controller bus 819.

The CPU 811 controls operation of an apparatus. Data required for the CPU 811 to execute a program is stored in the ROM 814 included in the main memory 813.

The ROM 814 is a memory circuit only for reading out data. Data stored in the ROM 814 is fixed in a manufacturing stage.

Process operation of the CPU 811 and data reading from the main memory 813 are performed repeatedly since programming data necessary for the CPU 811 to execute a command or a process is stored in the ROM 814. The ROM 814 consumes electric power in reading out data necessary for operating the CPU 811.

The RAM 815 is a memory circuit which is capable of writing or rewriting data. The RAM 815 is used mainly for storing a processing result of the CPU 811.

On the other hand, the dedicated circuit 812 is a circuit for executing fixed operation, and operates processing in response to a predetermined command only. Programming data necessary for the dedicated circuit 812 to execute processing is stored in the ROM 814, and the dedicated circuit 812 can execute the processing by reading out the programming data from the ROM 814. Input of a signal from an external device and output of a signal to an external device are executed via the input/output interface 816.

The address bus 817 is a wiring (route) for transmitting commands or data necessary for the CPU 811 to the main memory 813. The data bus 818 is a wiring (route) for reading and writing from/to the main memory 813 and for acquiring and providing data from/for external devices via the input/output interface 816. The controller bus 819 is a wiring (route) for providing controlling information to the main memory 813 and the input/output interface 816.

Any of the memory circuits described in Embodiments 1 to 3 can be applied to the ROM 814. The memory circuit described in Embodiment 4 can be applied to the main memory 813 including the ROM 814 and the RAM 815.

Note that this embodiment can be combined with any of the other embodiments and examples as appropriate.

(Embodiment 6)

In this embodiment, an example of a transistor including an oxide semiconductor will be described.

There is no particular limitation on the structure of the transistor including an oxide semiconductor which is disclosed in this specification; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed.

FIGS. 10A to 10D each illustrate an example of a cross-sectional structure of a transistor.

Transistors illustrated in FIGS. 10A to 10D each include an oxide semiconductor. An advantage of using an oxide semiconductor is that high mobility and extremely low off-state current can be obtained; however, needless to say, another semiconductor can be used.

Figure 10A:
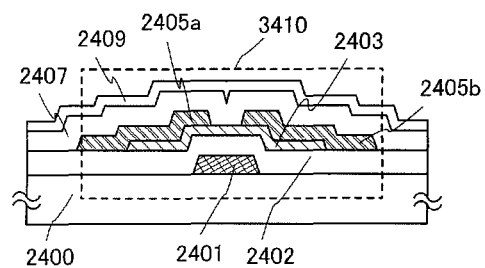
FIGS. 10A to 10D are each a cross-sectional view illustrating a structure of a transistor.

A transistor 3410 illustrated in FIG. 10A is one of bottom-gate transistors and is also called an inverted staggered transistor.

The transistor 3410 includes, over a substrate 2400 having all insulating surface, a gate electrode layer 2401, a gate insulating layer 2402, an oxide semiconductor layer 2403, a source electrode layer 2405a, and a drain electrode layer

2405b. In addition, an insulating layer 2407 and a protective insulating layer 2409 are formed so as to cover these components.

Figure 10B:
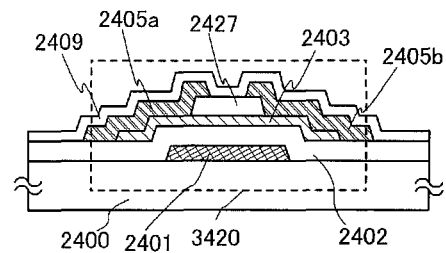

A transistor 3420 illustrated in FIG. 10B is one of bottom-gate transistors called channel protective transistors and is also referred to as an inverted staggered transistor.

The transistor 3420 includes, over the substrate 2400 having an insulating surface, the gate electrode layer 2401, the gate insulating layer 2402, the oxide semiconductor layer 2403, an insulating layer 2427 functioning as a channel protective layer which covers a channel formation region of the oxide semiconductor layer 2403, the source electrode layer 2405a, and the drain electrode layer 2405b. In addition, the protective insulating layer 2409 is formed so as to cover these components.

Figure 10C:
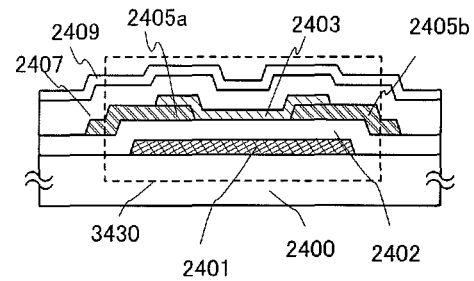

A transistor 3430 illustrated in FIG. 10C is a bottom-gate transistor, and includes, over the substrate 2400 having an insulating surface, the gate electrode layer 2401, the gate insulating layer 2402, the source electrode layer 2405a, the drain electrode layer 2405b, and the oxide semiconductor layer 2403. The insulating layer 2407 and the protective insulating layer 2409 are formed so as to cover these components.

In the transistor 3430, the gate insulating layer 2402 is provided on and in contact with the substrate 2400 and the gate electrode layer 2401, and the source electrode layer 2405a and the drain electrode layer 2405b are provided on and in contact with the gate insulating layer 2402. Further, the oxide semiconductor layer 2403 is provided over the gate insulating layer 2402, the source electrode layer 2405a, and the drain electrode layer 2405b.

Figure 10D:
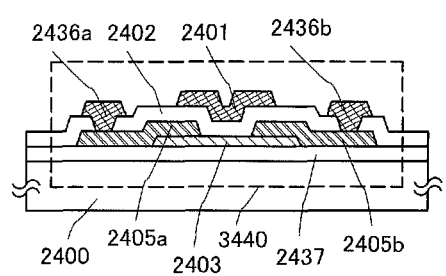

A transistor 3440 illustrated in FIG. 10D is one of top-gate transistors. The transistor 3440 includes, over the substrate 2400 having an insulating surface, an insulating layer 2437, the oxide semiconductor layer 2403, the source electrode layer 2405a, the drain electrode layer 2405b, the gate insulating layer 2402, and the gate electrode layer 2401. A wiring layer 2436a and a wiring layer 2436b are provided to be in contact with and electrically connected to the source electrode layer 2405a and the drain electrode layer 2405b, respectively.

In this embodiment, the oxide semiconductor layer 2403 is used as a semiconductor layer included in a transistor as described above. As an oxide semiconductor material used for the oxide semiconductor layer 2403, any of the following metal oxides can be used, for example: a four-component metal oxide such as an In—Sn—Ga—Zn—O-based metal oxide; three-component metal oxides such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide; two-component metal oxides such as an In—Zn—O-based metal oxide, a Sn—Zn—O-based metal oxide, an Al—Zn—O-based metal oxide, a Zn—Mg—O-based metal oxide, a Sn—Mg—O-based metal oxide, and an In—Mg—O-based metal oxide; an In—O-based metal oxide; a Sn—O-based metal oxide; and a Zn—O-based metal oxide. Further, Si may be contained in the oxide semiconductor. Here, for example, an In—Ga—Zn—O-based oxide semiconductor is an oxide containing at least In, Ga, and Zn, and there is no particular limitation on the composition ratio thereof. Further, the In—Ga—Zn—O-based oxide semiconductor may contain an element other than In, Ga, and Zn.

For the oxide semiconductor layer 2403, a thin film represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In the transistors 3410, 3420, 3430, and 3440 each including the oxide semiconductor layer 2403, the current value in an off state (off-state current value) can be small. Therefore, in the case where the transistor is connected to a charge accumulation node, leakage of charges can be prevented as much as possible.

In addition, each of the transistors 3410, 3420, 3430, and 3440 which include the oxide semiconductor layer 2403 can operate at high speed because they can achieve field-effect mobility that is relatively higher. Therefore, in a display device or an imaging device, for example, a driver circuit portion for driving pixels and a pixel portion can be formed over one substrate, so that the number of components can be reduced.

As the substrate 2400 having an insulating surface, a glass substrate formed of barium borosilicate glass, aluminoborosilicate glass, or the like can be used.

In the bottom-gate transistors 3410, 3420, and 3430, an insulating film serving as a base film may be provided between the substrate and the gate electrode layer. The base film has a function of preventing diffusion of an impurity element from the substrate, and can be formed to have a single-layer structure or a stacked-layer structure using one or more films selected from a silicon nitride film, a silicon oxide film, a silicon nitride oxide film, and a silicon oxynitride film.

The gate electrode layer 2401 can be formed using a metal material such as Mo, Ti, Cr, Ta, W, Al, Cu, Nd, or Sc, or an alloy material which contains any of these materials as its main component. The structure of the gate electrode layer 2401 is not limited to a single-layer structure and may be a stacked-layer structure of different films.

The gate insulating layer 2402 can be formed using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer, by a plasma CVD method, a sputtering method, or the like. The structure of the gate insulating layer 2402 is not limited to a single-layer structure and may be a stacked-layer structure of different films. For example, by a plasma CVD method, a silicon nitride layer ($SiN_y$ (y>0)) with a thickness greater than or equal to 50 nm and less than or equal to 195 nm is formed as a first gate insulating layer, and a silicon oxide layer ($SiO_x$ (x>0)) with a thickness greater than or equal to 5 nm and less than or equal to 150 nm is formed as a second gate insulating layer over the first gate insulating layer, so that a gate insulating layer with a total thickness of 200 nm is formed.

As the conductive film used for the source electrode layer 2405a and the drain electrode layer 2405b, for example, a film including an element selected from Al, Cr, Cu, Ta, Ti, Mo, and W, a film including an alloy containing any of these elements, or the like can be used. Alternatively, a structure may be employed in which a high-melting-point metal layer of Ti, Mo, W, or the like is stacked over and/or below a metal layer of Al, Cu, or the like. When an Al material to which an element (Si, Nd, Sc, or the like) preventing generation of a hillock, a whisker, or the like in an Al film is added is used, heat resistance can be increased.

A material similar to that of the source electrode layer 2405a and the drain electrode layer 2405b can be used for a conductive film such as the wiring layer 2436a and the wiring layer 2436b which are connected to the source electrode layer 2405a and the drain electrode layer 2405b, respectively.

Alternatively, the conductive film to be the source electrode layer 2405a and the drain electrode layer 2405b (including a wiring layer formed using the same layer as the source and drain electrode layers) may be formed using a conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), and such a metal oxide material containing silicon oxide.

As the insulating layers 2407, 2427, and 2437, an inorganic insulating film typified by a silicon oxide film, a silicon oxynitride film, an aluminum oxide film, or an aluminum oxynitride film can be used.

As the protective insulating layer 2409, an inorganic insulating film such as a silicon nitride film, an aluminum nitride film, a silicon nitride oxide film, or an aluminum nitride oxide film can be used.

A planarization insulating film may be formed over the protective insulating layer 2409 in order to reduce surface unevenness caused by the structure of the transistor. As the planarization insulating film, an organic material such as polyimide, acrylic, or benzocyclobutene can be used. As an alternative to such organic materials, it is possible to use a low-dielectric constant material (a low-k material) or the like. Note that the planarization insulating film may be formed by stacking a plurality of insulating films formed using these materials.

As described above, a high-performance semiconductor device can be provided with use of the transistor including an oxide semiconductor layer described in this embodiment.

Note that this embodiment can be combined with any of the other embodiments and examples as appropriate.

(Embodiment 7)

In this embodiment, an example of a method for manufacturing a transistor including an oxide semiconductor layer will be described in detail with reference to drawings.

FIGS. 11A to 11E are cross-sectional views illustrating an example of a manufacturing process of a transistor 2510. The transistor 2510 is an inverted staggered transistor having a bottom-gate structure, which is similar to the transistor 3410 illustrated in FIG. 10A.

An oxide semiconductor used for a semiconductor layer in this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that the oxide semiconductor is highly purified by removing hydrogen serving as a donor from the oxide semiconductor as much as possible so that impurities that are not main components of the oxide semiconductor are contained as little as possible. In other words, the oxide semiconductor used for a semiconductor layer in this embodiment is made to be an i-type (intrinsic) semiconductor or made to be close thereto not by addition of an impurity but by being highly purified by removal of an impurity such as hydrogen or water as much as possible. Accordingly, the oxide semiconductor layer included in the transistor 2510 is an oxide semiconductor layer which is highly purified and made to be electrically i-type (intrinsic).

In addition, the number of carries in the highly-purified oxide semiconductor is extremely small (close to zero), and the carrier concentration is lower than $1\times10^{14}/cm^3$, preferably lower than $1\times10^{12}/cm^3$, further preferably lower than $1\times10^{11}/cm^3$.

Since the oxide semiconductor includes extremely few carriers, off-state current can be reduced in the transistor. It is preferable that off-state current be as low as possible.

Specifically, in the transistor including the oxide semiconductor layer, the off-state current density per micrometer in channel width at room temperature can be less than or equal to 10 aA/μm ($1\times10^{-12}$ A/μm), further less than or equal to 1 aA/μm ($1\times10^{-18}$ A/μm), or still further less than or equal to 10 zA/μm ($1\times10^{-20}$ A/μm).

In addition, in the transistor 2510 including the oxide semiconductor layer, the temperature dependence of on-state current is hardly observed, and change in off-state current is extremely small.

A process of manufacturing the transistor 2510 over the substrate 2505 is described below with reference to FIGS. 11A to 11E.

First, a conductive film is formed over the substrate 2505 having an insulating surface, and then, a gate electrode layer 2511 is formed through a first photolithography step and an etching step. Note that a resist mask may be formed by an inkjet method. Formation of the resist mask by an inkjet method needs no photomask; thus, manufacturing cost can be reduced.

As the substrate 2505 having an insulating surface, a substrate similar to the substrate 2400 described in Embodiment 6 can be used. In this embodiment, a glass substrate is used as the substrate 2505.

An insulating film serving as a base film may be provided between the substrate 2505 and the gate electrode layer 2511. The base film has a function of preventing diffusion of an impurity element from the substrate 2505, and can be formed to have a single-layer structure or a stacked-layer structure using one or more of a silicon nitride film, a silicon oxide film, a silicon nitride oxide film, and a silicon oxynitride film.

The gate electrode layer 2511 can be formed using a metal material such as Mo, Ti, Cr, Ta, W, Al, Cu, Nd, or Sc, or an alloy material which contains any of these materials as its main component. The structure of the gate electrode layer 2511 is not limited to a single-layer structure and may be a stacked-layer structure of different films.

Next, a gate insulating layer 2507 is formed over the gate electrode layer 2511. The gate insulating layer 2507 can be formed using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like. The structure of the gate insulating layer 2507 is not limited to a single-layer structure and may be a stacked-layer structure of different films.

As the oxide semiconductor in this embodiment, an oxide semiconductor which is made to be an i-type semiconductor or a substantially i-type semiconductor by removal of an impurity is used. Such a highly-purified oxide semiconductor is highly sensitive to an interface state or interface charge; thus, an interface between the oxide semiconductor layer and the gate insulating layer is important. For that reason, the gate insulating layer that is to be in contact with a highly-purified oxide semiconductor needs to have high quality.

For example, high-density plasma CVD using microwaves (e.g., a frequency of 2.45 GHz) is preferable because a dense high-quality insulating layer having high withstand voltage can be formed. The highly-purified oxide semiconductor and the high-quality gate insulating layer are in close contact with each other, whereby the interface state can be reduced and favorable interface characteristics can be obtained.

Needless to say, another film formation method such as a sputtering method or a plasma CVD method can be employed as long as the method enables formation of a high-quality insulating layer as a gate insulating layer. Further, an insulating layer whose film quality and characteristic of the interface between the insulating layer and an oxide semiconductor are improved by heat treatment performed after formation of the insulating layer may be formed as the gate insulating layer. In any case, any insulating layer may be used as long as the insulating layer can reduce the interface state density of the interface between the insulating layer and an oxide semiconductor and form a favorable interface as well as having favorable film quality as a gate insulating layer. Here, an example of using a sputtering method will be described.

In order that hydrogen, a hydroxyl group, and moisture might be contained in the gate insulating layer 2507 and an oxide semiconductor film 2530 as little as possible, it is preferable that the substrate 2505 over which the gate electrode layer 2511 is formed or the substrate 2505 over which layers up to the gate insulating layer 2507 are formed be preheated in a preheating chamber of a sputtering apparatus as pretreatment for deposition of the oxide semiconductor film 2530 so that impurities such as hydrogen and moisture adsorbed to the substrate 2505 are eliminated and evacuated. As an evacuation unit provided for the preheating chamber, a cryopump is preferable. Note that this preheating treatment can be omitted. This preheating treatment may be similarly performed on the substrate 2505 over which layers up to a source electrode layer 2515a and a drain electrode layer 2515b are formed before formation of an insulating layer 2516.

Figure 11A:
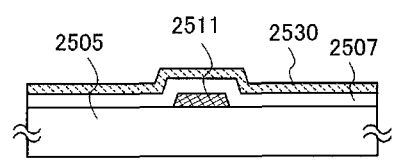
FIGS. 11A to 11E are cross-sectional views illustrating a manufacturing process of a transistor.
Figure 11B:
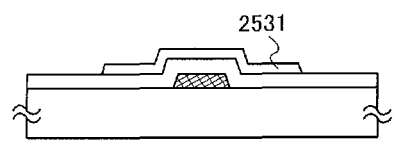
Figure 11C:
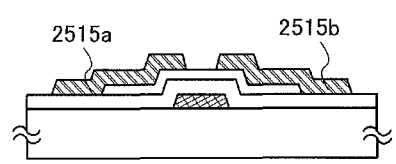

Next, the oxide semiconductor film 2530 having a thickness greater than or equal to 2 nm and less than or equal to 200 nm, preferably greater than or equal to 5 nm and less than or equal to 30 nm is formed over the gate insulating layer 2507 (see FIG. 11A).

Note that before the oxide semiconductor film 2530 is formed by a sputtering method, powder substances (also referred to as particles or dust) attached on a surface of the gate insulating layer 2507 are preferably removed by reverse sputtering in which an argon gas is introduced and plasma is generated. The reverse sputtering refers to a method in which voltage is not applied to a target side and voltage is applied to a substrate side with the use of an RF power source under an argon atmosphere and ionized argon collides with the substrate so that a substrate surface is modified. Note that instead of an argon atmosphere, a nitrogen atmosphere, a helium atmosphere, an oxygen atmosphere, or the like may be used.

As an oxide semiconductor used for the oxide semiconductor film 2530, an oxide semiconductor described in Embodiment 6, such as a four-component metal oxide, a three-component metal oxide, a two-component metal oxide, an In—O-based metal oxide, a Sn—O-based metal oxide, or a Zn—O-based metal oxide can be used. Further, Si may be contained in the above oxide semiconductor. In this embodiment, the oxide semiconductor film 2530 is formed by a sputtering method with the use of an In—Ga—Zn—O-based metal oxide target. A cross-sectional view at this stage corresponds to FIG. 11A. Alternatively, the oxide semiconductor film 2530 can be formed by a sputtering method under a rare gas (typically, argon) atmosphere, an oxygen atmosphere, or a mixed atmosphere containing a rare gas and oxygen.

As a target for forming the oxide semiconductor film 2530 by a sputtering method, for example, a metal oxide having a composition ratio of $In_2O_3:Ga_2O_3:ZnO=1:1:1$ [molar ratio] can be used. Alternatively, a metal oxide having a composition ratio of $In_2O_3:Ga_2O_3:ZnO=1:1:2$ [molar ratio] may be used. The filling rate of the target is higher than or equal to 90% and lower than or equal to 100%, preferably, higher than or equal to 95% and lower than or equal to 99.9%. With the use of the metal oxide target with high filling rate, the deposited oxide semiconductor film has high density.

It is preferable that a high-purity gas from which an impurity such as hydrogen, water, a hydroxyl group, or hydride is removed be used as the sputtering gas for the deposition of the oxide semiconductor film 2530.

The substrate is held in a deposition chamber under reduced pressure, and the substrate temperature is set to higher than or equal to 100° C. and lower than or equal to 600° C., preferably higher than or equal to 200° C. and lower than or equal to 400° C. Deposition is performed while the substrate is heated, whereby the impurity concentration in the oxide semiconductor film formed can be reduced. Moreover, damage to the oxide semiconductor film due to sputtering is reduced. The oxide semiconductor film 2530 is formed over the substrate 2505 in such a manner that residual moisture in the deposition chamber is removed, a sputtering gas from which hydrogen and moisture have been removed is introduced into the deposition chamber, and the above-described target is used. In order to remove moisture remaining in the deposition chamber, an entrapment vacuum pump, for example, a cryopump, an ion pump, or a titanium sublimation pump is preferably used. Further, an evacuation unit may be a turbo molecular pump provided with a cold trap. In the deposition chamber which is evacuated with the cryopump, a hydrogen atom, a compound containing a hydrogen atom such as water ($H_2O$), (more preferably, also a compound containing a carbon atom), and the like are removed, whereby the impurity concentration in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct-current power source is preferable because powder substances (also referred to as particles or dust) generated in deposition can be reduced and the film thickness can be uniform.

Then, the oxide semiconductor film 2530 is processed into an island-shaped oxide semiconductor layer by a second photolithography step and an etching step. A resist mask for forming the island-shaped oxide semiconductor layer may be formed by an inkjet method. Formation of the resist mask by an inkjet method needs no photomask; thus, manufacturing cost can be reduced.

In the case where a contact hole is formed in the gate insulating layer 2507, a step of forming the contact hole can be performed at the same time as processing of the oxide semiconductor film 2530.

Note that when the oxide semiconductor film 2530 is etched, dry etching, wet etching, or both dry etching and wet etching may be employed. As an etchant used for wet etching of the oxide semiconductor film 2530, for example, a mixed solution of phosphoric acid, acetic acid, and nitric acid such as ITO-07N (produced by KANTO CHEMICAL CO., INC.), or the like can be used.

Next, the oxide semiconductor layer is subjected to first heat treatment. The oxide semiconductor layer can be dehydrated or dehydrogenated by this first heat treatment. The first heat treatment is performed at a temperature higher than or equal 30 to 400° C. and lower than or equal to 750° C., or higher than or equal to 400° C. and lower than the strain point of the substrate under a nitrogen atmosphere or an atmosphere of a rare gas such as helium, neon, or argon. Here, the substrate is introduced into an electric furnace which is one of heat treatment apparatuses, and heat treatment is performed on the oxide semiconductor layer at 450° C. for one hour under a nitrogen atmosphere; thus, an oxide semiconductor layer 2531 which is dehydrated or dehydrogenated is obtained (see FIG. 11B).

Note that the heat treatment apparatus is not limited to an electrical furnace, and may be provided with a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object to be processed by heat treatment, such as nitrogen or a rare gas like argon, is used.

For example, as the first heat treatment, GRTA by which the substrate is moved into an inert gas heated to a temperature higher than or equal to 650° C. and lower than or equal to 700° C., heated for several minutes, and moved out of the inert gas heated to the high temperature may be performed.

Note that in the first heat treatment, it is preferable that water, hydrogen, and the like be not contained in the inert gas which is introduced into the heat treatment apparatus. It is preferable that the purity of the inert gas be 6N (99.9999%) or higher, preferably 7N (99.99999%) or higher (that is, the impurity concentration is 1 ppm or lower, preferably 0.1 ppm or lower).

Further, after the oxide semiconductor layer is heated through the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. The purity of an oxygen gas or an $N_2O$ gas which is introduced into the heat treatment apparatus is preferably 6N or higher, further preferably 7N or higher (that is, the impurity concentration in the oxygen gas or the $N_2O$ gas is 1 ppm or lower, preferably 0.1 ppm or lower). It is preferable that water, hydrogen, and the like be not contained in these gases in particular. By the action of the oxygen gas or the $N_2O$ gas, oxygen which is a main component of the oxide semiconductor and which has been eliminated through the step for removing impurities by dehydration or dehydrogenation can be supplied. Through this step, the oxide semiconductor layer can be highly purified and made to be an electrically i-type (intrinsic) oxide semiconductor.

The first heat treatment for the oxide semiconductor layer can be performed on the oxide semiconductor film 2530 that has not been processed into the island-shaped oxide semiconductor layer. In that case, the substrate is taken out of the heat apparatus after the first heat treatment, and then a photolithography step is performed.

Note that the first heat treatment may be performed at any of the following timings other than the above timing as long as it is performed after deposition of the oxide semiconductor layer: after the source electrode layer and the drain electrode layer are formed over the oxide semiconductor layer; and after the insulating layer is formed over the source electrode layer and the drain electrode layer.

Further, in the case where a contact hole is formed in the gate insulating layer 2507, the formation of the contact hole may be performed either before or after the first heat treatment is performed on the oxide semiconductor film 2530.

Further, an oxide semiconductor layer formed in the following manner may also be used: an oxide semiconductor is deposited twice, and heat treatment is performed thereon twice. Through such steps, a crystal region which is c-axis-aligned perpendicularly to a surface of the film and has a large thickness can be formed without depending on a base component.

For example, a first oxide semiconductor film with a thickness greater than or equal to 3 nm and less than or equal to 15 nm is deposited, and first heat treatment is performed at a temperature higher than or equal to 450° C. and lower than or equal to 850° C., preferably higher than or equal to 550° C. and lower than or equal to 750° C., under a nitrogen atmosphere, an oxygen atmosphere, a rare gas atmosphere, or a dry air atmosphere, so that a first oxide semiconductor film having a crystal region in a region including a surface is formed. Then, a second oxide semiconductor film which has a larger thickness than the first oxide semiconductor film is formed, and second heat treatment is performed at a temperature higher than or equal to 450° C. and lower than or equal to 850° C., preferably higher than or equal to 600° C. and lower than or equal to 700° C.

Through such steps, in the entire second oxide semiconductor film, crystal growth can proceed from the lower part to the upper part using the first oxide semiconductor film as a seed crystal, whereby an oxide semiconductor layer having a thick crystal region is formed.

Next, a conductive film to be the source electrode layer and the drain electrode layer (including a wiring formed from the same layer as the source electrode layer and the drain electrode layer) is formed over the gate insulating layer 2507 and the oxide semiconductor layer 2531. As the conductive film serving as the source electrode layer and the drain electrode layer, the material similar to that of the source electrode layer 2405*a* and the drain electrode layer 2405*b* which is described in Embodiment 6 can be used.

A resist mask is formed over the conductive film in a third photolithography step and selective etching is performed, so that the source electrode layer 2515*a* and the drain electrode layer 2515*b* are formed. Then, the resist mask is removed (see FIG. 11C).

Ultraviolet light, KrF laser light, or ArF laser light is preferably used for light exposure for forming the resist mask in the third photolithography step. The channel length L of the transistor that is completed later is determined by a distance between bottom end portions of the source electrode layer and the drain electrode layer, which are adjacent to each other over the oxide semiconductor layer 2531. In the case where the channel length L is less than 25 um, the light exposure at the time of the formation of the resist mask in the third photolithography step may be performed using extreme ultraviolet light having an extremely short wavelength of several nanometers to several tens of nanometers. Light exposure with extreme ultraviolet light leads to a high resolution and a large depth of focus. Thus, the channel length L of the transistor to be completed later can be greater than or equal to 10 nm and less than or equal to 1000 nm and the operation speed of a circuit can be increased, and furthermore the off-state current is extremely small, and thus lower power consumption can be achieved.

In order to reduce the number of photomasks and steps in the photolithography step, the etching step may be performed using a resist mask formed with a multi-tone mask. Since a multi-tone mask through which light is transmitted to have a plurality of intensities, a resist mask having a plurality of thicknesses can be formed with use of the multi-tone mask.

The resist mask can be changed in shape by ashing, so that different patterns can be provided without a photolithography process. Thus, the number of light-exposure masks can be reduced and the number of corresponding photolithography steps can also be reduced, whereby simplification of a process can be realized.

Note that it is preferable that etching conditions be optimized so as not to etch and divide the oxide semiconductor layer 2531 when the conductive film is etched. However, it is difficult to obtain etching conditions in which only the conductive film is etched and the oxide semiconductor layer 2531 is not etched at all. In some cases, only part of the oxide semiconductor layer 2531 is etched to be an oxide semiconductor layer having a groove portion (a depressed portion) when the conductive film is etched.

In this embodiment, a Ti film is used as the conductive film and an In—Ga—Zn—O-based oxide is used as the oxide semiconductor layer 2531; thus, an ammonia hydrogen peroxide solution (a mixed solution of ammonia, water, and a hydrogen peroxide solution) is preferably be used as an etchant of the conductive film.

Next, the insulating layer 2516 serving as a protective insulating film in contact with part of the oxide semiconductor layer is formed. Before the formation of the insulating layer 2516, plasma treatment using a gas such as $N_2O$, $N_2$, or Ar may be performed to remove water or the like adsorbed on an exposed surface of the oxide semiconductor layer.

The insulating layer 2516 can be formed to a thickness of at least 1 nm by a method through which an impurity such as water or hydrogen does not enter the insulating layer 2516, such as a sputtering method, as appropriate. When hydrogen is contained in the insulating layer 2516, hydrogen might enter the oxide semiconductor layer or oxygen might be extracted from the oxide semiconductor layer by hydrogen. In such a case, the resistance of the oxide semiconductor layer on the backchannel side might be decreased (the oxide semiconductor layer on the backchannel side might have n-type conductivity) and a parasitic channel might be formed. Therefore, it is important to use a method through which hydrogen and an impurity containing hydrogen are not contained for forming the insulating layer 2516.

In this embodiment, a 200-nm-thick silicon oxide film is formed as the insulating layer 2516 by a sputtering method. The substrate temperature in film formation is higher than or equal to room temperature and lower than or equal to 300° C. and in this embodiment, is 100° C. The silicon oxide film can be formed by a sputtering method under a rare gas (typically, argon) atmosphere, an oxygen atmosphere, or a mixed atmosphere containing a rare gas and oxygen. As a target, a silicon oxide target or a silicon target may be used. For example, silicon oxide can be formed using silicon as a target by a sputtering method under an atmosphere containing oxygen. For the insulating layer 2516 which is formed in contact with the oxide semiconductor layer, an inorganic insulating film that hardly contains impurities such as moisture, a hydrogen ion, and a hydroxyl group and that blocks entry of such impurities from the outside is preferably used. Typically, a silicon oxide film, a silicon oxynitride film, an aluminum oxide film, an aluminum oxynitride film, or the like can be used.

In order to remove moisture remaining in the deposition chamber for forming the insulating layer 2516 at the same time as deposition of the oxide semiconductor film 2530, an entrapment vacuum pump (such as a cryopump) is preferably used. When the insulating layer 2516 is deposited in the deposition chamber evacuated using a cryopump, the impurity concentration in the insulating layer 2516 can be reduced. Alternatively, as an evacuation unit for removing moisture remaining in the deposition chamber for forming the insulating layer 2516, a turbo molecular pump provided with a cold trap may be used.

It is preferable that a high-purity gas from which an impurity such as hydrogen, water, a hydroxyl group, or hydride is removed be used as the sputtering gas for the deposition of the insulating layer 2516.

Next, second heat treatment (preferably at higher than or equal to 200° C. and lower than or equal to 400° C., for example, higher than or equal to 250° C. and lower than or equal to 350° C.) is performed under an inert gas atmosphere or an oxygen gas atmosphere. For example, the second heat treatment is performed at 250° C. for one hour under a nitrogen atmosphere. In the second heat treatment, part of the oxide semiconductor layer (a channel formation region) is heated in the state where it is in contact with the insulating layer 2516.

Through the above steps, oxygen which is one of main components of an oxide semiconductor and which is reduced together with an impurity such as hydrogen, moisture, a hydroxyl group, or hydride (also referred to as a hydrogen compound) through the first heat treatment performed on the oxide semiconductor film can be supplied. Thus, the oxide semiconductor layer is highly purified and is made to be an electrically i-type (intrinsic) semiconductor.

Figure 11D:
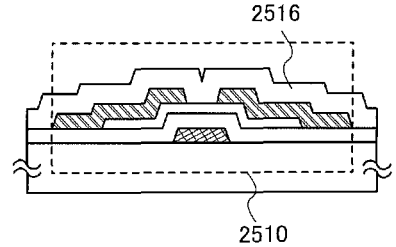
Figure 11E:
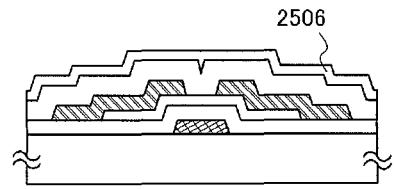

Through the above steps, the transistor 2510 is formed (see FIG. 11D).

When a silicon oxide layer having a lot of defects is used as the oxide insulating layer, an impurity such as hydrogen, moisture, a hydroxyl group, or hydride contained in the oxide semiconductor layer can be diffused into the silicon oxide layer by the heat treatment performed after the silicon oxide layer is formed. That is, the impurity in the oxide semiconductor layer can be further reduced.

A protective insulating layer 2506 may be further formed over the insulating layer 2516. For example, a silicon nitride film is formed by a sputtering method. An inorganic insulating film which hardly contains an impurity such as moisture and can block entry of the impurity from the outside, such as a silicon nitride film or an aluminum nitride film, is preferably used as the protective insulating layer. In this embodiment, a silicon nitride film is used as the protective insulating layer 2506 (see FIG. 11E).

The silicon nitride film used as the protective insulating layer 2506 is formed in such a manner that the substrate 2505 over which layers up to the insulating layer 2516 are formed is heated to higher than or equal to 100° C. and lower than or equal to 400° C., a sputtering gas containing high-purity nitrogen from which hydrogen and moisture are removed is introduced, and a silicon target is used. Also in that case, the protective insulating layer 2506 is preferably formed while moisture remaining in the treatment chamber is removed, in a manner similar to that of the insulating layer 2516.

After the protective insulating layer is formed, heat treatment may be further performed at higher than or equal to 100° C. and lower than or equal to 200° C. for longer than or equal to one hour and shorter than or equal to 30 hours under the atmosphere. This heat treatment may be performed at a fixed temperature. Alternatively, the following change in temperature is set as one cycle and may be repeated plural times: the temperature is increased from room temperature to a heating temperature and then decreased to room temperature.

As described above, with the use of the transistor including a highly-purified oxide semiconductor layer manufactured according to this embodiment, the current value in an off state (off-state current value) can be further reduced.

In addition, since the transistor including a highly-purified oxide semiconductor layer has high field-effect mobility, high-speed operation is possible. In a display device, for example, a driver circuit portion and a pixel portion can be formed over one substrate, and thus the number of components can be reduced. Note that this embodiment can be combined with any of the other embodiments and examples as appropriate.

EXAMPLE 1

In recent years, wireless chips have been attracting a great deal of attention as a small semiconductor device in which an IC chip and an antenna for radio communication are combined. With a wireless chip, data can be input and output by transmitting and receiving communication signals (operation magnetic field) using a radio communication device (hereinafter referred to as a reader/writer).

For example, a wireless chip can be applied for managing goods in the distribution industry. Although as for now, goods are managed with the use of bar codes in general, bar codes are scanned optically and thus data cannot be scanned if there is an optical obstacle.

With the use of a wireless chip, on the other hand, data can be scanned wirelessly and thus scanning is practicable even if there is an optical obstacle as long as a radio wave is not blocked. Therefore, goods can be managed more efficiently at lower cost using a wireless chip. Furthermore, a wireless chip can be applied to a wide range of use, for example, tickets, plane tickets, automatic charge, and the like.

With extension of the application field of a wireless chip, demand for a higher-functional wireless chip has been increasing. For example, data leakage to a third party can be prevented by coding transmission/reception data. For coding data, methods of performing decoding/encoding processing using hardware, using software, and using both hardware and software are known.

In the method of performing processing using hardware, an arithmetic circuit is configured with a dedicated circuit which executes coding and decoding.

In the method of performing processing using software, an arithmetic circuit is configured with a CPU and a high-capacity memory, and coding and decoding programs are executed with the CPU.

In the method of performing processing both using hardware and software, an arithmetic circuit is configured with a dedicated circuit, a CPU, and a memory circuit; part of arithmetic operation for coding and decoding is executed with the dedicated circuit, and the other programs of arithmetic operation are executed with the CPU using software.

In any one of the methods, a wireless chip is required to be equipped with a high-capacity memory circuit. According to one embodiment of the present invention, an increase in power consumption due to an increase in a capacity of a memory circuit can be prevented.

Figure 9:
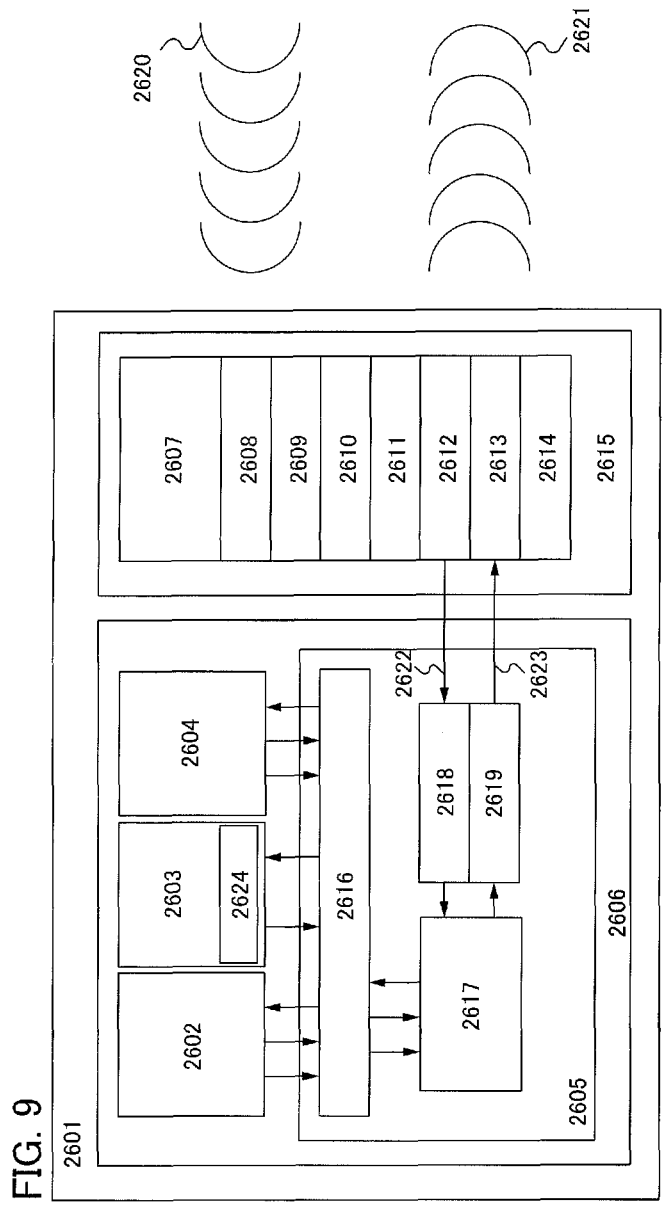
FIG. 9 is a block diagram illustrating a configuration example of a wireless chip.

In this example, a wireless chip having a decoding function will be described as an example of a semiconductor device equipped with a CPU, a dedicated circuit, and a memory circuit. FIG. 9 is a block diagram of a wireless chip.

A block configuration of a wireless chip will be described with reference to FIG. 9. A wireless chip 2601 includes an arithmetic circuit 2606 and an analog unit 2615.

The arithmetic circuit 2606 includes a CPU 2602, a ROM 2603, a RAM 2604, and a controller 2605.

The analog unit 2615 includes an antenna 2607, a resonance circuit 2608, a power supply circuit 2609, a reset circuit 2610, a clock generation circuit 2611, a demodulation circuit 2612, a modulation circuit 2613, and a power supply management circuit 2614.

Power consumption of a whole wireless chip can be efficiently reduced by applying any of the memory circuits described in Embodiments 1 to 3 to the ROM 2603. Power consumption of a whole wireless chip can be efficiently reduced by applying the memory circuit described in Embodiment 4 to the RAM 2604. In addition, the reduction in power consumption can suppress heat generation of the wireless chip.

The controller 2605 includes a CPU interface (CPUIF) 2616, a control register 2617, a code extraction circuit 2618, and an encoding circuit 2619.

In FIG. 9, communication signals are shown separately as a reception signal 2620 and a transmission signal 2621 for simplicity. In fact, however, they constitute a unified signal, and are transmitted and received at the same time between the wireless chip 2601 and a reader/writer. The reception signal 2620 is received at the antenna 2607 and the resonance circuit 2608, and is demodulated in the demodulation circuit 2612. The transmission signal 2621 is modulated in the modulation circuit 2613, and is transmitted from the antenna 2607.

An induced electromotive force is generated by the antenna 2607 and the resonance circuit 2608 when the wireless chip 2601 is put in a magnetic field formed by a communication signal. The induced electromotive force is held and stabilized by electrical capacitance in the power supply circuit 2609, and supplied to each circuit in the wireless chip 2601 as a power supply voltage.

The reset circuit 2610 generates an initial reset signal of the whole wireless chip 2601. For example, a signal that rises after the increase in the power supply voltage is generated as a reset signal.

In the clock generation circuit 2611, a frequency and duty ratio of a clock signal is changed depending on a control signal generated in the power supply management circuit 2614.

In the demodulation circuit 2612, a change of the amplitude of the reception signal 2620 modulated by an ASK method is detected as the reception data 2622 of "0"/"1". The demodulation circuit 2612 is a low-pass filter, for example.

The modulation circuit 2613 transmits transmission data after changing the amplitude of the ASK transmission signal 2621. For example, if the transmission data 2623 is "0", the resonance point of the resonance circuit 2608 is changed so as to change the amplitude of the communication signal.

The power supply management circuit 2614 monitors a power supply voltage which is supplied from the power supply circuit 2609 to the arithmetic circuit 2606 or the current consumption in the arithmetic circuit 2606, and generates a signal for controlling the clock generation circuit 2611.

An operation of the wireless chip of this example is described.

First, the reception signal 2620 including ciphertext data, which is transmitted from the reader/writer, is received by the wireless chip 2601. The reception signal 2620 is demodulated in the demodulation circuit 2612, and then divided in the code extraction circuit 2618 into a control command, ciphertext data, and the like, which are subsequently stored in the control register 2617.

Here, the control command is data specifying a response of the wireless chip 2601, for example, transmission of a unique ID number, operation stop, cipher breaking, and the like. Here, a control command of cipher breaking is to be received.

Next, in the arithmetic circuit 2606, the CPU 2602 breaks (decodes) the ciphertext in accordance with a code breaking program stored in the ROM 2603 by using a secret key 2624 stored in advance in the ROM 2603. The decoded ciphertext (decoded text) is stored in the control register 2617. At this time, the RAM 2604 is used as a data storing region.

Note that the CPU 2602 accesses the ROM 2603, the RAM 2604, and the control register 2617 through the CPUIF 2616. The CPUIF 2616 has a function of generating an access signal for any of the ROM 2603, the RAM 2604, and the control register 2617 based on an address required by the CPU 2602.

The encoding circuit 2619 generates the transmission data 2623 from the decoded text, which is then modulated in the modulation circuit 2613. Next, the transmission signal 2621 is transmitted from the antenna 2607 to the reader/writer.

Note that this example is described, as an arithmetic method, a processing method using software, that is, a method in which the arithmetic circuit is configured with the CPU and the high-capacity memory, and a program is executed with the CPU; however, it is also possible to select an optimum arithmetic method according to the purpose and form the arithmetic circuit based on the selected method.

For example, as another arithmetic method, there are methods of performing processing using hardware and using both hardware and software. In the method of processing using hardware, an arithmetic circuit may be a dedicated circuit. In the method of processing using both hardware and software, an arithmetic circuit may include a dedicated circuit, a CPU, and a memory circuit so that the dedicated circuit performs part of arithmetic operation and that the CPU may execute programs of the other part of arithmetic operation using software.

Note that this example can be combined with any of the other embodiments and examples as appropriate.

EXAMPLE 2

Some uses of a semiconductor device 3000, which functions as the wireless chip described in Example 1, will be described.

Figure 12A:
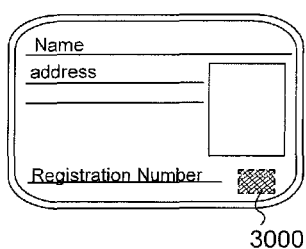
FIGS. 12A to 12F are each a diagram illustrating use of the wireless chip.
Figure 12B:
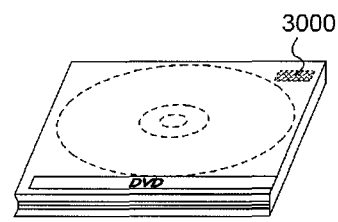
Figure 12C:
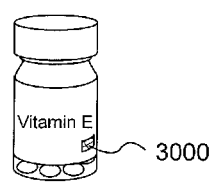
Figure 12D:
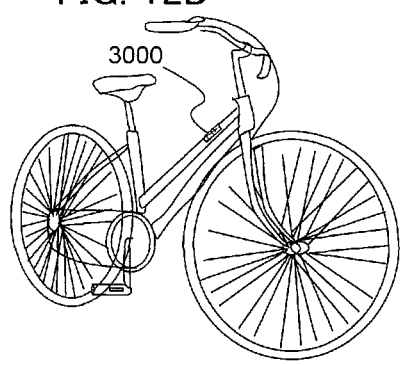
Figure 12E:
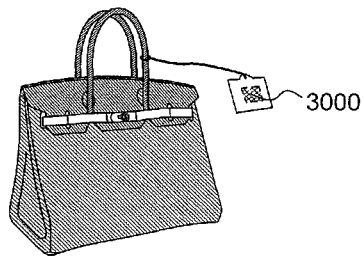
Figure 12F:
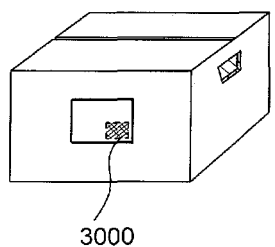

Wireless chips can be employed for many uses and can be used by being mounted in objects such as bills, coins, securities, bearer bonds, certificates (e.g., driver's licenses, or resident cards; see FIG. 12A), containers for wrapping objects (e.g., wrapping paper, or bottles; see FIG. 12C), recording media (e.g., DVD software, or video tapes; see FIG. 12B), vehicles (e.g., bicycles; see FIG. 12D), personal belongings (e.g., bags, or glasses), foods, plants, animals, human bodies, clothes, daily necessities, and products such as electronic devices, or shipping tags of baggage (see FIGS. 12E and 12F).

The semiconductor device 3000 which is one embodiment of the present invention includes a memory element, and is mounted on a printed wiring board, attached to a surface of an object, or incorporated in an object, so that the semiconductor device 3000 is fixed in the object. For example, the semiconductor device may be incorporated in paper of a book or an organic resin of a package.

By providing the semiconductor device 3000 which is one embodiment of the present invention in bills, coins, securities, bearer bonds, certificates, and the like, an identification function can be obtained and forgery thereof can be prevented by utilizing the identification function. Further, by providing the semiconductor device which is one embodiment of the present invention in containers for wrapping devices, recording media, personal belongings, foods, clothes, daily necessities, electronic devices, and the like, a system such as an inspection system can be used efficiently.

Note that this example can be combined with any of the other embodiments and examples as appropriate.

This application is based on Japanese Patent Application serial no. 2010-070401 filed with Japan Patent Office on Mar. 25, 2010, the entire contents of which are hereby incorporated by reference.

The invention claimed is:

1. A semiconductor device comprising:
 a central processing unit; and
 a memory circuit comprising:
  a first memory cell defined by a first bit line and a first word line intersecting with each other; and
  a second memory cell defined by a second bit line and a second word line intersecting with each other,
 wherein the first memory cell comprises a first transistor,
 wherein the second memory cell does not comprise a semiconductor element,
 wherein the first transistor comprises an oxide semiconductor in a channel formation region,
 wherein a gate of the first transistor is electrically connected to the first word line, a drain of the first transistor is electrically connected to the first bit line, and a source of the first transistor is electrically connected to a reference potential line,
 wherein the memory circuit stores data of a program, and
 wherein the central processing unit is configured to execute an operation based on the program.

2. The semiconductor device according to claim 1,
 wherein the memory circuit further comprises a second transistor,
 wherein the second transistor comprises an oxide semiconductor in a channel formation region, and
 wherein a gate of the second transistor is electrically connected to a pre-charge line, a drain of the second transistor is electrically connected to at least one of the first bit line and the second bit line, and a source of the second transistor is electrically connected to a first power supply line.

3. The semiconductor device according to claim 2,
 wherein the memory circuit further comprises a latch circuit,
 wherein the latch circuit comprises a first inverter circuit and a third transistor,
 wherein an input terminal of the first inverter circuit and a drain of the third transistor are electrically connected to at least one of the first bit line and the second bit line,
 wherein an output terminal of the first inverter circuit is electrically connected to a gate of the third transistor, and
 wherein a source of the third transistor is electrically connected to a second power supply line.

4. The semiconductor device according to claim 3,
 wherein the memory circuit further comprises a second inverter circuit,
 wherein an input terminal of the second inverter circuit is electrically connected to at least one of the first bit line and the second bit line,
 wherein an output terminal of the second inverter circuit is electrically connected to an output terminal of the semiconductor device,
 wherein high data and low data constitute data of the program,
 wherein the first memory cell stores one of the high data, and
 wherein the number of the high data of the program is less than the number of the low data of the program.

5. The semiconductor device according to claim 4,
wherein the memory circuit further comprises memory cells electrically connected to the second word line, and
wherein the memory cells do not comprise a semiconductor element.

6. The semiconductor device according to claim 1,
wherein the memory circuit further comprises a latch circuit,
wherein the latch circuit comprises a first inverter circuit and a third transistor,
wherein an input terminal of the first inverter circuit and a drain of the third transistor are electrically connected to at least one of the first bit line and the second bit line,
wherein an output terminal of the first inverter circuit is electrically connected to a gate of the third transistor, and
wherein a source of the third transistor is electrically connected to a second power supply line.

7. The semiconductor device according to claim 1,
wherein the memory circuit further comprises a second inverter circuit,
wherein an input terminal of the second inverter circuit is electrically connected to at least one of the first bit line and the second bit line,
wherein an output terminal of the second inverter circuit is electrically connected to an output terminal of the semiconductor device,
wherein high data and low data constitute data of the program,
wherein the first memory cell stores one of the high data, and
wherein the number of the high data of the program is less than the number of the low data of the program.

8. The semiconductor device according to claim 1,
wherein the memory circuit further comprises memory cells electrically connected to the second word line, and
wherein the memory cells do not comprise a semiconductor element.

9. A semiconductor device comprising:
a dedicated circuit; and
a memory circuit comprising:
 a first memory cell defined by a first bit line and a first word line intersecting with each other; and
 a second memory cell defined by a second bit line and a second word line intersecting with each other,
wherein the first memory cell comprises a first transistor,
wherein the second memory cell does not comprise a semiconductor element,
wherein the first transistor comprises an oxide semiconductor in a channel formation region,
wherein a gate of the first transistor is electrically connected to the first word line, a drain of the first transistor is electrically connected to the first bit line, and a source of the first transistor is electrically connected to a reference potential line,
wherein the memory circuit stores data of a program, and
wherein the dedicated circuit is configured to execute an arithmetic operation based on the program.

10. The semiconductor device according to claim 9,
wherein the memory circuit further comprises a second transistor,
wherein the second transistor comprises an oxide semiconductor in a channel formation region, and
wherein a gate of the second transistor is electrically connected to a pre-charge line, a drain of the second transistor is electrically connected to at least one of the first bit line and the second bit line, and a source of the second transistor is electrically connected to a first power supply line.

11. The semiconductor device according to claim 9,
wherein the memory circuit further comprises a latch circuit,
wherein the latch circuit comprises a first inverter circuit and a third transistor,
wherein an input terminal of the first inverter circuit and a drain of the third transistor are electrically connected to at least one of the first bit line and the second bit line,
wherein an output terminal of the first inverter circuit is electrically connected to a gate of the third transistor, and
wherein a source of the third transistor is electrically connected to a second power supply line.

12. The semiconductor device according to claim 9,
wherein the memory circuit further comprises a second inverter circuit,
wherein an input terminal of the second inverter circuit is electrically connected to at least one of the first bit line and the second bit line,
wherein an output terminal of the second inverter circuit is electrically connected to an output terminal of the semiconductor device,
wherein high data and low data constitute data of the program,
wherein the first memory cell stores one of the high data, and
wherein the number of the high data of the program is less than the number of the low data of the program.

13. The semiconductor device according to claim 9,
wherein the memory circuit further comprises memory cells electrically connected to the second word line, and
wherein the memory cells do not comprise a semiconductor element.

14. A semiconductor device comprising:
a central processing unit;
a dedicated circuit; and
a memory circuit comprising:
 a first memory cell defined by a first word line and a first bit line intersecting with each other; and
 a second memory cell defined by a second word line and a second bit line intersecting with each other,
wherein the first memory cell comprises a first transistor,
wherein the second memory cell does not comprise a semiconductor element,
wherein the first transistor comprises an oxide semiconductor in a channel formation region,
wherein a gate of the first transistor is electrically connected to the first word line, a drain of the first transistor is electrically connected to the first bit line, and a source of the first transistor is electrically connected to a reference potential line,
wherein the memory circuit stores data of a program,
wherein the central processing unit is configured to execute an operation based on the program, and
wherein the dedicated circuit is configured to execute an arithmetic operation based on the program.

15. The semiconductor device according to claim 14,
wherein the memory circuit further comprises a second transistor,
wherein the second transistor comprises an oxide semiconductor in a channel formation region, and
wherein a gate of the second transistor is electrically connected to a pre-charge line, a drain of the second transistor is electrically connected to at least one of the first bit line and the second bit line, and a source of the second transistor is electrically connected to a first power supply line.

16. The semiconductor device according to claim 14,
wherein the memory circuit further comprises a latch circuit,
wherein the latch circuit comprises a first inverter circuit and a third transistor,
wherein an input terminal of the first inverter circuit and a drain of the third transistor are electrically connected to at least one of the first bit line and the second bit line,
wherein an output terminal of the first inverter circuit is electrically connected to a gate of the third transistor, and
wherein a source of the third transistor is electrically connected to a second power supply line.

17. The semiconductor device according to claim 14,
wherein the memory circuit further comprises a second inverter circuit,
wherein an input terminal of the second inverter circuit is electrically connected to at least one of the first bit line and the second bit line,
wherein an output terminal of the second inverter circuit is electrically connected to an output terminal of the semiconductor device,
wherein high data and low data constitute data of the program,
wherein the first memory cell stores one of the high data, and
wherein the number of the high data of the program is less than the number of the low data of the program.

18. The semiconductor device according to claim 14,
wherein the memory circuit further comprises memory cells electrically connected to the second word line, and
wherein the memory cells do not comprise a semiconductor element.

* * * * *